(12) United States Patent
Kato et al.

(10) Patent No.: US 8,476,827 B2
(45) Date of Patent: Jul. 2, 2013

(54) LIGHT EMITTING ELEMENT, LIGHT EMITTING DEVICE AND ELECTRIC APPLIANCE USING THE SAME

(75) Inventors: Kaoru Kato, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/294,458

(22) Filed: Nov. 11, 2011

(65) Prior Publication Data
US 2012/0119252 A1 May 17, 2012

Related U.S. Application Data

(63) Continuation of application No. 11/886,384, filed as application No. PCT/JP2006/305892 on Mar. 17, 2006, now Pat. No. 8,058,794.

(30) Foreign Application Priority Data

Mar. 25, 2005 (JP) ................................. 2005-089378

(51) Int. Cl.
*H01J 1/62* (2006.01)
*H01J 63/04* (2006.01)
(52) U.S. Cl.
USPC ............................ 313/506; 313/498; 313/512
(58) Field of Classification Search
USPC .................................................. 313/498–512
See application file for complete search history.

(56) References Cited

U.S. PATENT DOCUMENTS

| 6,288,487 | B1 | 9/2001 | Arai |
| 6,373,186 | B1 | 4/2002 | Arai et al. |
| 6,781,152 | B2 | 8/2004 | Yamazaki |
| 7,005,196 | B1 | 2/2006 | Carter et al. |
| 7,045,369 | B2 | 5/2006 | Yamazaki et al. |

(Continued)

FOREIGN PATENT DOCUMENTS

| CN | 1261761 A | 8/2000 |
| CN | 1269690 A | 10/2000 |

(Continued)

OTHER PUBLICATIONS

Tang, C.W. et al, "Organic Electroluminescent Diodes," Appl. Phys. Lett., vol. 51, No. 12, Sep. 21, 1987, pp. 913-915.

(Continued)

*Primary Examiner* — Ahn Mai
*Assistant Examiner* — Kevin Quarterman
(74) *Attorney, Agent, or Firm* — Husch Blackwell LLP

(57) ABSTRACT

It is an object of the present invention to provide a light emitting element with low drive voltage. In addition, it is another object to provide a light emitting device having the light emitting element. Further in addition, it is another object to provide an electric appliance which has a light emitting element with low drive voltage. A light emitting element of the present invention comprises a pair of electrodes, a layer containing a light emitting element and a layer containing a mixture material which contains a conductive material formed from an inorganic compound and an insulating material formed from an inorganic compound, which are interposed between the pair of electrodes, wherein the layer containing the mixture material has a resistivity of 50,000 to 1,000,000 ohm cm, preferably, 200,000 to 500,000 ohm cm. The drive voltage of the light emitting element can be lowered with the foregoing structure.

18 Claims, 12 Drawing Sheets

U.S. PATENT DOCUMENTS

| | | | |
|---|---|---|---|
| 7,119,364 B2 | 10/2006 | Yamazaki | |
| 7,154,218 B2 | 12/2006 | Murakami et al. | |
| 7,158,161 B2 | 1/2007 | Gyoutoku et al. | |
| 7,255,939 B2 | 8/2007 | Carter et al. | |
| 7,358,661 B2 | 4/2008 | Kuma | |
| 7,614,929 B2 | 11/2009 | Murakami et al. | |
| 7,727,779 B2 | 6/2010 | Yamazaki et al. | |
| 8,039,288 B2 | 10/2011 | Yamazaki | |
| 2002/0101152 A1* | 8/2002 | Kimura | 313/505 |
| 2003/0127974 A1* | 7/2003 | Miyazawa | 313/504 |
| 2003/0189401 A1 | 10/2003 | Kido et al. | |
| 2003/0193289 A1 | 10/2003 | Shirakawa et al. | |
| 2003/0197466 A1* | 10/2003 | Yamazaki et al. | 313/504 |
| 2004/0004434 A1* | 1/2004 | Nishi et al. | 313/506 |
| 2004/0161192 A1 | 8/2004 | Hamano et al. | |
| 2005/0040762 A1* | 2/2005 | Kurihara | 313/512 |
| 2005/0052127 A1 | 3/2005 | Sakata et al. | |
| 2005/0057151 A1* | 3/2005 | Kuwabara | 313/506 |
| 2005/0093432 A1 | 5/2005 | Yamazaki et al. | |
| 2005/0212420 A1* | 9/2005 | Sakakura et al. | 313/512 |
| 2006/0049410 A1 | 3/2006 | Hosokawa et al. | |
| 2006/0228822 A1 | 10/2006 | Hayakawa et al. | |
| 2007/0131948 A1 | 6/2007 | Seo et al. | |
| 2007/0182317 A1 | 8/2007 | Kido et al. | |
| 2008/0164811 A1 | 7/2008 | Kuma | |
| 2011/0217801 A1 | 9/2011 | Yamazaki | |

FOREIGN PATENT DOCUMENTS

| | | |
|---|---|---|
| CN | 1447629 A | 10/2003 |
| EP | 1 022 789 A2 | 7/2000 |
| EP | 1 022 789 A3 | 7/2000 |
| EP | 1 041 654 A1 | 10/2000 |
| EP | 1 096 835 A1 | 5/2001 |
| EP | 1 122 794 A2 | 8/2001 |
| EP | 1 198 017 A2 | 4/2002 |
| EP | 1 524 551 A1 | 4/2005 |
| EP | 1 633 169 A1 | 3/2006 |
| EP | 1 351 558 B1 | 7/2006 |
| EP | 2 182 777 A1 | 5/2010 |
| EP | 2 197 247 A1 | 6/2010 |
| EP | 2 261 978 A1 | 12/2010 |
| JP | 2-288092 | 11/1990 |
| JP | 5-159880 | 6/1993 |
| JP | 5-326147 | 12/1993 |
| JP | 2000-215985 | 8/2000 |
| JP | 2000-223276 | 8/2000 |
| JP | 2000-268969 | 9/2000 |
| JP | 2000-294376 | 10/2000 |
| JP | 2000-306669 | 11/2000 |
| JP | 2001-290439 | 10/2001 |
| JP | 2002-190390 | 7/2002 |
| JP | 2002-532848 | 10/2002 |
| JP | 2002-352950 | 12/2002 |
| JP | 2002-367784 | 12/2002 |
| JP | 2003-272860 | 9/2003 |
| JP | 2004-134395 | 4/2004 |
| JP | 2004-192876 | 7/2004 |
| WO | WO 00/36662 A1 | 6/2000 |
| WO | WO 2004/017137 A1 | 2/2004 |
| WO | WO 2004/055897 A2 | 7/2004 |
| WO | WO 2004/055897 A3 | 7/2004 |
| WO | WO 2004/095892 A1 | 11/2004 |
| WO | WO 2005/006460 A1 | 1/2005 |

OTHER PUBLICATIONS

International Search Report re application No. PCT/JP2006/305892, dated Jun. 6, 2006.

Written Opinion re application No. PCT/JP2006/305892, dated Jun. 6, 2006.

Office Action re Chinese application No. CN 200680009418.2, dated Feb. 27, 2009 (with English translation).

* cited by examiner

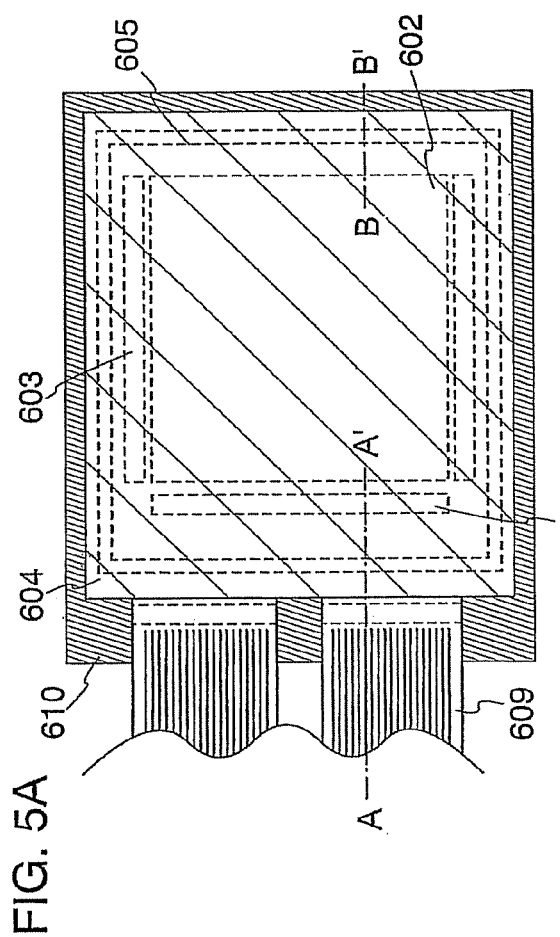
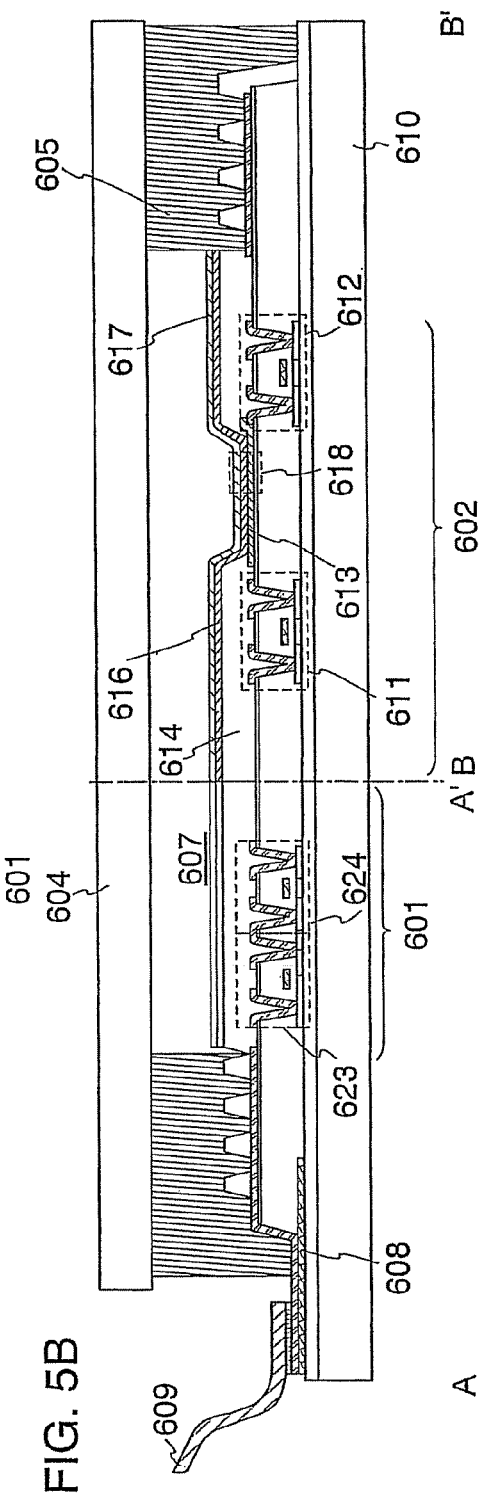
FIG. 5A
FIG. 5B

LIGHT EMITTING ELEMENT, LIGHT EMITTING DEVICE AND ELECTRIC APPLIANCE USING THE SAME

This application is a continuation of U.S. application Ser. No. 11/886,384 filed on Sep. 14, 2007 now U.S. Pat. No. 8,058,794 which is the US National stage of PCT/JP2006/305892 filed Mar. 17, 2006.

TECHNICAL FIELD

The present invention relates to a light emitting element using electroluminescence and a light emitting device having the light emitting element. In addition, the present invention relates to an electric appliance using the light emitting element.

BACKGROUND ART

A light emitting element using a light emitting material has features such as thinness, light weight, high speed response, direct current low voltage driving, and the like, and is expected to be applied to a next-generation flat panel display. A light emitting device in which light emitting elements are arranged in matrix is said to have superiority in wider viewing angle and higher visibility over a conventional liquid crystal display device.

A basic structure of a light emitting element is a structure in which a layer containing a light emitting organic compound (a light emitting layer) is interposed between a pair of electrodes. By applying voltage to the element, electrons from one of the pair of electrodes and holes from the other electrode are transported to the light emitting layer, so that current flows. The carriers (electrons and holes) are recombined, and thus, the light emitting organic compound is excited. When the light emitting organic compound returns to a ground state from the excited state, light is emitted.

It is to be noted that the excited state generated by an organic compound can be a singlet excited state or a triplet excited state, and light emission from the singlet excited state is referred to as fluorescence, and light emission from the triplet excited state is referred to as phosphorescence.

Since such a light emitting element is usually formed by using an organic thin film having a thickness of, for example, approximately 0.1 µm, it is a great advantage that the light emitting element can be manufactured to be thin and lightweight. In addition, since the time from carrier injection to light emission is approximately microseconds or less, it is also one of the features that the speed of response is quite fast. Further, since sufficient light emission can be obtained at a direct voltage of several to several tens of volts, the power consumption is relatively low. From these advantages, the light emitting element has been attracted attention as a next-generation flat panel display element.

In addition, since the light emitting element is formed to have the shape of a film, planar light emission can be obtained easily by forming a large-area element. This is a feature that is hardly obtained by a point light source typified by a filament lamp and an LED or a linear light source typified by a fluorescent light. Therefore, the light emitting element also has a high utility value as a surface light source that can be applied to lighting and the like.

However, these light emitting elements have problems with durability and heat resistance, which hinders the development of the light emitting elements. Since a light emitting element is usually formed by stacking organic thin films containing organic compounds as typified by the following Non-Patent Document 1, low durability of the organic compounds and fragility of the organic thin film are considered to be causes of the problems described above.

On the other hand, there has been an attempt to form a light emitting element by using a layer in which an organic compound and an inorganic compound are mixed instead of an organic thin film. For example, the following Patent Document 1 discloses a light-emitting element using a light-emitting layer in which fluorescent organic molecules are dispersed in metal oxide. In addition, the following Patent Document 2 discloses a light-emitting element formed by stacking a layer in which organic compounds (such as a hole transporting compound, an electron transporting compound, and a light emitting compound) are dispersed in a silica matrix while being covalently bound to the silica matrix. In these references, it is reported that the durability and the heat resistance of the element is improved.

In the light emitting elements disclosed in the foregoing Patent Documents 1 and 2, the organic compound is simply dispersed in metal oxide which is insulating. Therefore, these light emitting elements have a problem that current is hard to flow (that is, the voltage needed to apply a certain amounts of current is increased) compared with conventional light emitting elements.

In these light emitting elements, since the light emission luminance is increased in proportion to applied current density, the fact that current is hard to flow leads to a problem that a voltage for obtaining a certain luminance (that is, drive voltage) is also increased. Accordingly, when the organic compound is simply dispersed in the metal oxide, increase in drive voltage and increase in power consumption are caused even if durability and heat resistance can be obtained.

In addition, in order to suppress short circuit of a light emitting element due to dust and the like, it is effective to make a film thickness of the light emitting element thicker. However, when a structure in which the film thickness is made thicker is employed as shown in the Patent Documents 1 and 2, the drive voltage is further increased. That is, in the conventional structure, it is practically difficult to make the film thickness thicker.

[Non-Patent Document 1] C. W. Tang et al., Applied Physics Letters, Vol. 51 (12), 913-915 (1987)

[Patent Documents 1] Japanese Patent Publication No. H2-288092

[Patent Documents 2] Japanese Patent Publication No. 2000-306669

DISCLOSURE OF INVENTION

In the view of the foregoing problems, it is an object of the present invention to provide a light emitting element with low drive voltage. In addition, it is another object to provide a light emitting device having the light emitting element. Further, it is another object to provide an electric appliance which has the light emitting element with low drive voltage.

The present inventors have found that chive voltage of a light emitting element can be lowered by using a layer containing a mixture material which contains a conductive material formed from an inorganic compound and an insulating material formed from an inorganic compound, which has a resistivity of $5 \times 10^4$ to $1 \times 10^6$ $\Omega \cdot cm$.

That is, a light emitting element of the present invention comprises a pair of electrodes and a layer containing a light emitting material interposed between the pair of electrodes, and a layer containing a mixture material which contains a conductive material formed from an inorganic compound and an insulating material formed from an inorganic compound between the pair of electrodes, wherein the layer containing the mixture material preferably has a resistivity of $5\times10^4$ to $1\times10^6$ Ω·cm, more preferably, $2\times10^5$ to $5\times10^5$ Ω·cm.

In the foregoing structure, the layer containing the mixture material is in contact with at least one of the pair of electrodes.

In the foregoing structure, a visible light transmittance of the layer containing the mixture material is 80 to 100%

In the foregoing structure, the insulating material is preferably any of metal oxide, metal nitride, and metal oxynitride. Specifically, silicon oxide, germanium oxide, titanium oxide, molybdenum oxide, aluminum oxide, silicon nitride, aluminum nitride, silicon oxynitride, and the like can be given.

In the foregoing structure, the conductive material is a transparent conductive film material. Specifically, the conductive material contains any of indium oxide, zinc oxide, tin oxide, cadmium oxide, and gallium oxide.

The present invention includes a light emitting device having the foregoing light emitting element and a control means for controlling light emission of the light emitting element in its scope. The light emitting device in this specification includes an image display device and a light source (including a lighting device). Further, the light emitting device also includes all of the following modules: a module having a light emitting device provided with a connector such as an FPC (Flexible Printed Circuit), a TAB (Tape Automated Bonding) tape, or a TCP (Tape Carrier Package); a module having a TAB tape or a TCP provided with a printed wiring board at the ends thereof; and a module having an IC (Integrated Circuit) directly mounted on a light emitting element by a COG (Chip On Glass) method.

In addition, the present invention includes an electric appliance which has a display device including the light emitting element and a control means for controlling light emission of the light emitting element in its scope.

Drive voltage of the light emitting element can be lowered by using a layer containing a conductive material formed from an inorganic compound and an insulating material formed from an inorganic compound, which has a resistivity of $5\times10^4$ to $1\times10^6$ Ω·cm, preferably, $2\times10^5$ to $5\times10^5$ Ω·cm.

By using the layer having the mixture material containing a conductive material formed from an inorganic compound and an insulating material formed from an inorganic compound, which has a resistivity of $5\times10^4$ to $1\times10^6$ Ω·cm, preferably, $2\times10^5$ to $5\times10^5$ Ω·cm, increase in the drive voltage of the light emitting element can be suppressed even when the layer having the mixture material is thickened.

BRIEF DESCRIPTION OF DRAWINGS

FIGS. 5A and 5B are views for explaining a light emitting device of the present invention;

BEST MODE FOR CARRYING OUT THE INVENTION

Figure 1A:
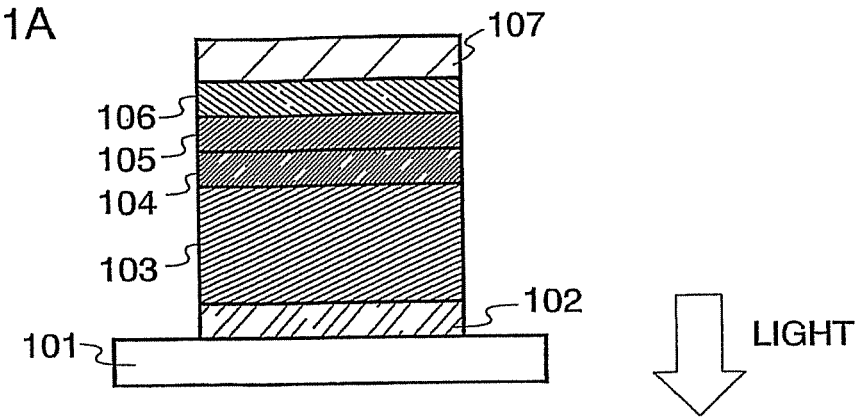
FIGS. 1A to 1C are views for explaining a light emitting element of the present invention.

Embodiment modes according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below.

As for a pair of electrodes in a light emitting element of the present invention, when a voltage is applied so that a potential of one electrode thereof becomes higher than that of the other electrode, light is emitted. At this time, one electrode having a higher potential is referred to as an electrode serving as an anode, and the other electrode having a lower potential is referred to as an electrode serving as a cathode.

Embodiment Mode 1

In this embodiment mode, a mixture material to be used for a light emitting element of the present invention is described.

The mixture material to be used in the present invention contains a conductive material formed from an inorganic compound and an insulating material formed from an inorganic compound. The conductive material preferably has a high visible light transmittance. For example, an indium oxide based material including indium oxide such as indium tin oxide (ITO) which is indium oxide doped with tin oxide, and a conductive material of indium oxide doped with titanium oxide (ITiO); zinc oxide based material including zinc oxide such as zinc oxide doped with aluminum oxide (AZO), zinc oxide doped with gallium oxide (GZO), and zinc oxide doped with indium oxide (IZO); a tin oxide based material such as tin oxide doped with antimony oxide or fluorine; a cadmium oxide based material; a gallium oxide based material; and the like can be used.

As the insulating material, metal oxide, metal nitride, metal nitride oxide, or the like is preferably used. As a specific example, silicon oxide, germanium oxide, titanium oxide, molybdenum oxide, aluminum oxide, silicon nitride, aluminum nitride, and the like can be given. In addition, the insulating material preferably has a high visible light transmittance. As a material having a high visible light transmittance, $SiO_2$, $GeO_2$, $TiO_2$, $Al_2O_3$, or the like can be given. A transmittance of the mixture material can be increased by using an insulating material having a high visible light transmittance.

A resistivity of a layer having the mixture material containing the conductive material and the insulating material is preferably $5\times10^4$ to $1\times10^6$ Ω·cm, more preferably, $2\times10^5$ to $5\times10^5$ Ω·cm. Low voltage driving of the light emitting element can be realized by mixing the conductive material and the insulating material to form a layer having the mixture material having a resistivity of the foregoing ranges.

It is to be noted that when the resistivity of the layer containing the mixture material is too high, drive voltage of the light emitting element is increased. On the other hand, when resistivity of the layer is too small, there arises a possibility of generation of crosstalk of adjacent light emitting elements. Crosstalk means generation of a leakage of current between light emitting elements.

Figure 10:
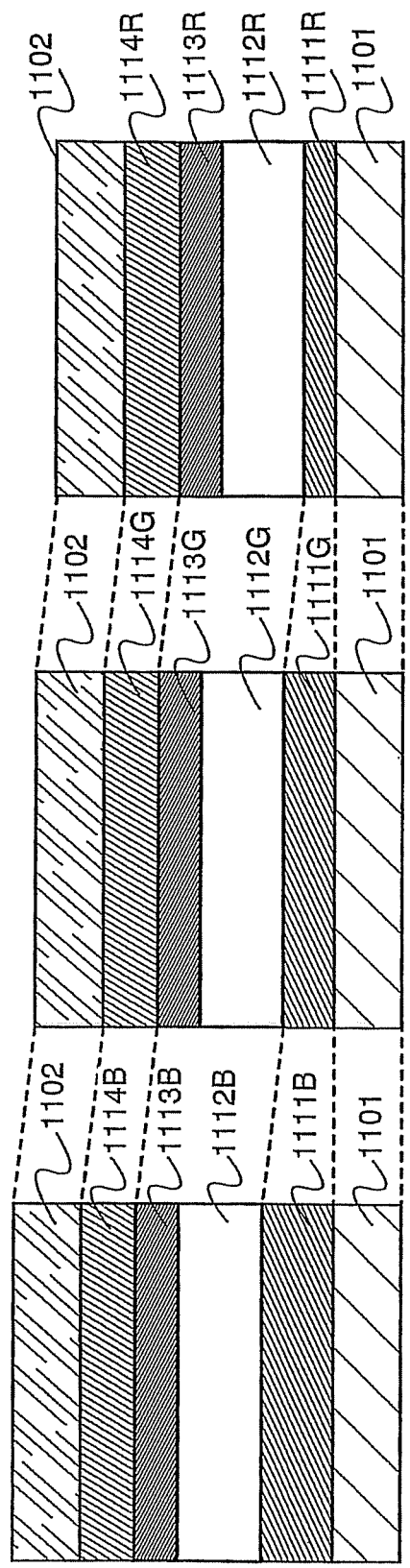
FIG. 10 is a view for explaining a light emitting element of the present invention.

For example, as shown in FIG. 10, each of the light emitting elements which emit light of red color (R), green color (G), and blue color (B) has a first electrode 1101 which is a reflective electrode and a second electrode 1102 which is a light transmitting electrode. The light emitting elements also have a first layer 1111R, 1111G, and 1111B; a second layer 1112R, 1112G, and 1112B; a third layer 1113R, 1113G, and 1113B; and a fourth layer 1114R, 1114G, and 1114B, respectively. In such a case, crosstalk means a short circuit and leakage of current between the first electrode 1101 of the light emitting element of green color (G) and the second electrode 1102 of the light emitting element of red color (R).

Therefore, the resistivity of the layer having the mixture material containing the conductive material and the insulating material of the present invention is preferably $5\times10^4$ to $1\times10^6$ $\Omega\cdot cm$, more preferably, $2\times10^5$ to $5\times10^5$ $\Omega\cdot cm$.

In addition, a visible light transmittance of the mixture material of the present invention is preferably 80 to 100%. Since the mixture material to be used in the present invention has a high visible light transmittance, light emitted from the light emitting layer can be extracted outside efficiently.

Further, since the mixture material to be used in the present invention has a high visible light transmittance, a decrease in light extraction efficiency can be suppressed even when the layer having the mixture material is thickened. Thereby, optimization of a film thickness of the layer having the mixture material can be achieved while increase in the drive voltage can be suppressed so that the light extraction efficiency to outside can be increased.

In addition, a film thickness of the layer containing the mixture material can be thickened in order to prevent a short circuit due to dust, impact, or the like.

The layer containing the mixture material to be used in the present invention can be formed by a sputtering method. In that case, a target having a conductive material formed from an inorganic compound and an insulating material formed from an inorganic compound is used. By adjusting a composition ratio of the conductive material and the insulating material in the target, the layer having the mixture material with a resistivity of $5\times10^4$ to $1\times10^6$ $\Omega\cdot cm$ can be obtained.

The layer having the mixture material can also be formed by co-sputtering using a target of a conductive material formed from an inorganic compound, and a target of an insulating material formed from an inorganic compound. In that case, by adjusting an area of each target, the composition ratio of the conductive material and the insulating material in the layer having the mixture material can be changed, so that the layer having the mixture material with a resistivity of $5\times10^4$ to $1\times10^6$ $\Omega\cdot cm$ can be obtained.

The target can be formed by a method in which powder of a conductive material and powder of an insulating material are mixed by a ball mill or the like and the obtained material is pressure-formed and heated for sintering. By using the thus obtained target, the layer having the mixture material of the present invention is formed.

Sputtering is conducted under inert gas such as argon. When oxygen is contained in the conductive material or the insulating material, oxygen is preferably contained in the inert gas in order to prevent deoxidation and composition deviation when the layer having the mixture material is formed.

In addition, the layer having the mixture material of the present invention can be formed by a multi-target sputtering method. The layer having the mixture material of the present invention can be formed by using a target formed from a conductive material and a target formed from an insulating material and applying high-frequency power thereto separately. By changing an amount of the high-frequency power to be applied, the resistivity of the layer having the mixture material to be obtained can be controlled. For example, when a large amount of high-frequency power is applied to the target formed from an insulating material, the ratio of the insulating material contained in the mixture material becomes higher and when a large amount of high-frequency power is applied to the target formed from a conductive material, the ratio of the conductive material contained in the mixture material becomes higher.

It is to be noted that when the layer having the mixture material is formed over an organic compound, the layer is preferably formed using a facing target sputtering apparatus in which a region where plasma is generated is apart from a region where a film is formed so that damage on the organic compound is reduced. In a facing target sputtering apparatus, a pair of targets is placed parallel to each other and a substrate is placed facing a space between the pair of the targets so that a region where plasma is generated is apart from a region where a film is formed and damage due to plasma to a layer of the organic compound formed over the substrate can be prevented.

It is to be noted that in this specification, the material having a high visible light transmittance preferably has a visible light transmittance of 80 to 100%.

Embodiment Mode 2

A light emitting element of the present invention has a plurality of layers interposed between a pair of electrodes. The plurality of layers are laminated layers formed by stacking a layer formed from a material with a high carrier injection property and a layer with a high carrier transport property so that carriers are recombined with each other in a region which is apart from the electrodes.

An example of the light emitting element of the present invention is described hereinafter with reference to FIG. 1A.

In this embodiment mode, the light emitting element has a first electrode 102; a first layer 103, a second layer 104, a third layer 105, and a fourth layer 106 formed sequentially over the first electrode 102; and a second electrode 107 formed thereover. It is to be noted that in this embodiment mode, the following description is made assuming that the first electrode 102 serves as an anode and the second electrode 107 serves as a cathode.

A substrate 101 serves as a support body for the light emitting element. Glass, plastic, or the like can be used for the substrate 101. It is to be noted that another material can be employed as long as the material serves as a support body for the light emitting element during manufacturing steps.

The first electrode 102 can be formed from various kinds of a metal, an alloy, and a conductive compound, as well as a mixture thereof. For example, in addition to indium tin oxide (ITO), indium tin oxide containing silicon, indium oxide containing zinc oxide (ZnO) at 2 to 20 wt % (Indium Zinc Oxide, IZO), and a conductive material of indium oxide doped with titanium oxide (ITiO); gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum-silicon (Al—Si), aluminum-titanium (Al—Ti), aluminum-silicon-copper (Al—Si—Cu), and a nitride of a metal material (such as titanium nitride), and the like can be used. When the first electrode is used as the anode, the first electrode is preferably formed from a material having a high work function (work function of 4.0 eV or more) among the foregoing materials.

It is to be noted that the first electrode 102 is not restricted to be formed from a material having a high work function. A material having a low work function can be used for the first electrode 102 as well.

The first layer 103 is a layer having the mixture material containing a conductive material formed from an inorganic compound and an insulating material formed from an inorganic compound described in Embodiment Mode 1. A resistivity of the first layer is preferably $5 \times 10^4$ to $1 \times 10^6$ $\Omega \cdot$cm, more preferably, $2 \times 10^5$ to $5 \times 10^5$ $\Omega \cdot$cm.

It is to be noted that the first layer 103 may have not only such a single layer structure as described above but also a laminated structure of two or more layers. For example, a structure in which two or more layers containing a conductive material formed from an inorganic compound and an insulating material formed from an inorganic compound are stacked and the mixing ratio of one layer is different from that of another layer can be employed.

The second layer 104 is a layer formed from a material having a high hole transport property. For example, an aromatic amine compound (in other words, a compound having a benzene ring-nitrogen bond) such as 4,4'-bis[N-(1-naphthyl)-N-phenylamino]biphenyl (abbreviation: α-NPD), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), or 4,4',4"-tris[N-(3-methylphenyl)-N-phenylamino]triphenylamine (abbreviation: MTDATA) can be used. Many of the foregoing materials are materials having a hole mobility of $10^{-6}$ cm$^2$/Vs or more. However, a material other than the foregoing materials may be used as long as it has a higher hole transport property than an electron transport property. It is to be noted that the second layer 104 may have not only a single layer structure but also a laminated structure of two or more layers formed from the foregoing materials.

The third layer 105 is a layer containing a material having a high light emission property. For example, the third layer 105 is formed by freely combining a material having a high light emission property such as N,N'-dimethylquinacridone (abbreviation: DMQd), and 3-(2-benzothiazolyl)-7-diethylaminocoumarin (abbreviation: coumarin 6); and a material having a high carrier transport property and an excellent film quality (that is, a material which is hard to be crystallized) such as tris(8-quinolinolato)aluminum (abbreviation: Alq$_3$), and 9,10-di(2-naphthyl)anthracene (abbreviation: DNA). However, the third layer 105 may have a single layer structure of Alq$_3$ or DNA, since both Alq$_3$ and DNA have a high light emission property.

The fourth layer 106 is formed from a material having a high electron transport property. For example, a metal complex having a quinoline skeleton or a benzoquinoline skeleton such as tris(8-quinolinolato)aluminum (abbreviation: Alq$_3$), tris(5-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolato-aluminum (abbreviation: BAlq), or the like can be used. Alternatively, a metal complex having an oxazole ligand or a thiazole ligand such as bis[2-(2-hydroxyphenyl) benzoxazolato]zinc (abbreviation: Zn(BOX)$_2$) or bis[2-(2-hydroxyphenyl)-benzothiazolato]zinc (abbreviation: Zn(BTZ)$_2$), or the like can be used. In addition to a metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be used. Many of the foregoing materials are materials having an electron mobility of $10^{-6}$ cm$^2$/Vs or more. However, a material other than the foregoing materials may be used for the fourth layer 106 as long as it has a higher electron transport property than a hole transport property. It is to be noted that the fourth layer 106 may have not only a single layer structure but also a laminated structure of two or more layers formed from the foregoing materials.

The second electrode 107 can be formed from metal, an alloy, a conductive compound, a mixture thereof, or the like, which has a low work function (3.8 eV or less). As a specific example of such a cathode material, an element belonging to Group 1 or 2 of the Periodic Table, in other words, an alkali metal such as lithium (Li) or cesium (Cs); an alkaline earth metal such as magnesium (Mg), calcium (Ca), or strontium (Sr); an alloy (Mg:Ag or Al:Li) containing the foregoing materials can be used. However, by providing a layer for promoting electron injection between the second electrode 107 and the light emitting layer, so as to be stacked with the second electrode, a various kinds of conductive materials such as Al, Ag, ITO, and ITO containing silicon can be used for the second electrode 107 regardless of the magnitude of the work function.

The layer for promoting electron injection can be formed from a compound of an alkali metal or an alkaline earth metal, such as lithium fluoride (LiF), cesium fluoride (CsF), or calcium fluoride (CaF$_2$). In addition, a layer which is formed from a material having an electron transport property and which contains an alkali metal or an alkaline earth metal, for example, Alq$_3$ containing magnesium (Mg) can be used.

In addition, the first layer 103, the second layer 104, the third layer 105, and the fourth layer 106 can be formed by various methods. For example, a sputtering method, a vapor deposition method, an ink jet method, and a spin coating method can be used. Different methods may be used to form respective electrodes or respective layers.

In the light emitting element of the present invention having the foregoing structure, current flows due to a potential difference between the first electrode 102 and the second electrode 107, and a hole and an electron are recombined in the third layer 105 which is a layer containing a material with a high light emission property, thereby, light is emitted. In other words, a light emitting region is formed in the third layer 105. However, the whole of the third layer 105 does not necessarily serve as a light emitting region. For example, the light emitting region may be formed only on the second layer 104 side or the fourth layer 106 side in the third layer 105.

Figure 1B:
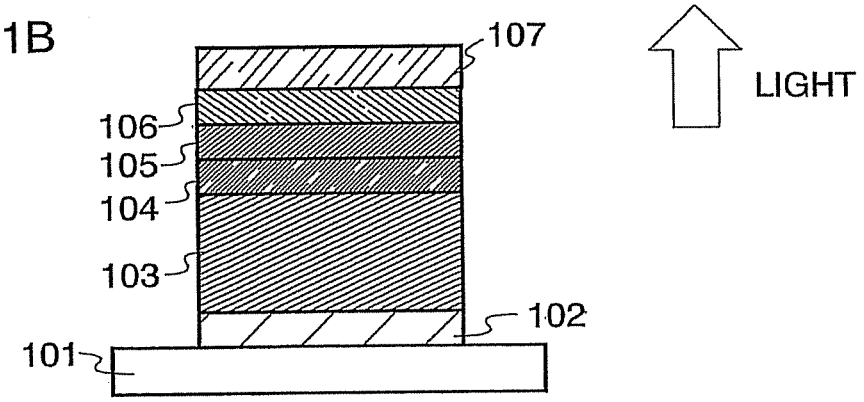

Light is extracted outside through either or both the first electrode 102 and the second electrode 107. Accordingly, either or both the first electrode 102 and the second electrode 107 are formed from a light transmitting material. When only the first electrode 102 is formed from a light transmitting material, light is extracted from the substrate side through the first electrode 102 as shown in FIG. 1A. When only the second electrode 107 is formed from a light transmitting material, light is extracted from the side opposite to the substrate through the second electrode 107 as shown in FIG. 1B.

Figure 1C:
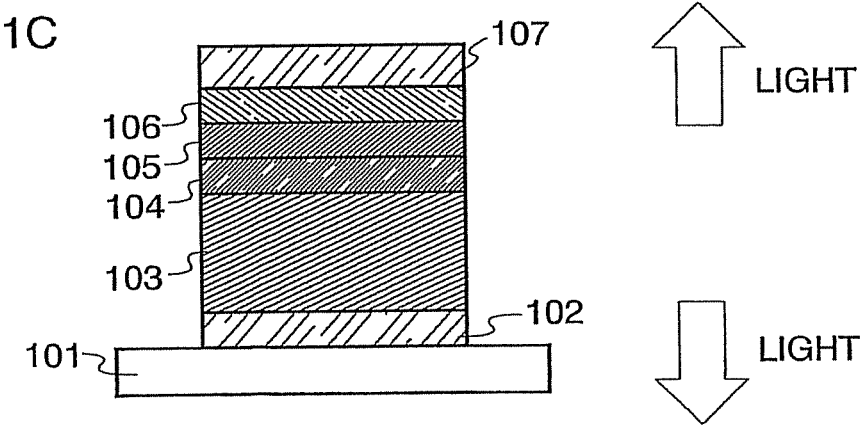

When both the first electrode 102 and the second electrode 107 are formed from a light transmitting material, light is extracted from both the substrate side and the opposite side through the first electrode 102 and the second electrode 107 as shown in FIG. 1C.

It is to be noted that a structure of a layer provided between the first electrode 102 and the second electrode 107 is not restricted to the foregoing structures. Another structure can be employed as long as it is a structure in which a region where electrons and holes are recombined is set apart from the first electrode 102 and the second electrode 107 so that quenching of light emission due to proximity of the light emitting region and metal is suppressed, and in which a layer which has the mixture material containing a conductive material formed from an inorganic compound and an insulating material formed from an inorganic compound and has a resistivity of preferably $5 \times 10^4$ to $1 \times 10^6$ Ω·cm, more preferably, $2 \times 10^5$ to $5 \times 10^5$ Ω·cm is included.

In other words, a lamination structure of the layers is not particularly restricted, and the lamination structure may be formed by freely combining layers formed from a material having a high electron transport property, a material having a high hole transport property, a material having a high electron injection property, a material having a high hole injection property, a material having a bipolar property (a material having a high electron and hole transport property), or the like with the layer having the mixture material of the present invention. Alternatively, a structure in which a carrier recombination region is controlled by providing a layer formed from a silicon oxide film or the like over the first electrode 102 may be employed.

Figure 2:
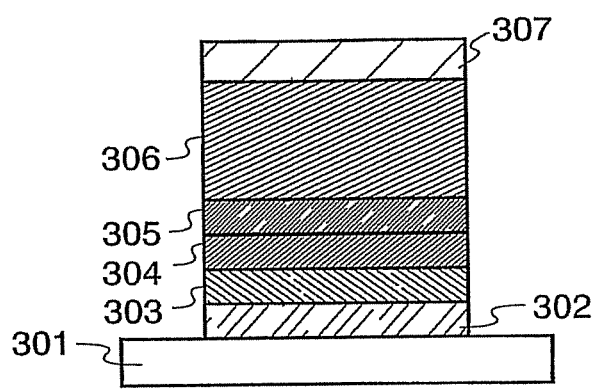
FIG. 2 is a view for explaining a light emitting element of the present invention.

A light emitting element shown in FIG. 2 has a structure in which a first layer 303 fanned from a material having a high electron transport property, a second layer 304 containing a material having a high light emission property, a third layer 305 formed from a material having a high hole transport property, a fourth layer 306 having the mixture material of the present invention, and a second electrode 307 serving as an anode are sequentially stacked over a first electrode 302 serving as a cathode. It is to be noted that reference numeral 301 denotes a substrate.

In this embodiment mode, the light emitting element is manufactured over a substrate formed from glass, plastic, or the like. A passive matrix light emitting device can be manufactured by manufacturing a plurality of such light emitting elements over one substrate. Alternatively, a thin film transistor (TFT), for example, is fowled over a substrate formed from glass, plastic, or the like, and a light emitting element may be formed over an electrode electrically connected with the TFT. Thereby, an active matrix type light emitting device in which drive of the light emitting element is controlled by the TFT. It is to be noted that the structure of the TFT is not particularly restricted and a staggered type or an inverted staggered type may be employed. In addition, crystallinity of a semiconductor used for the TFT is not particularly restricted and a crystalline semiconductor or an amorphous semiconductor may be used. Further, a driver circuit formed over a TFT array substrate may include both an n-type TFT and a p-type TFT, or either of them.

The light emitting element of the present invention includes a layer which has a mixture material containing a conductive material and an insulating material, and which has a resistivity of preferably $5 \times 10^4$ to $1 \times 10^6$ Ω·cm, more preferably, $2 \times 10^5$ to $5 \times 10^5$ Ω·cm. Thereby, low voltage driving of the light emitting element can be realized.

In addition, since the mixture material to be used in the present invention has a high visible light transmittance, light emitted from the light emitting layer can be extracted outside efficiently.

In addition, since the mixture material used in the present invention has a high visible light transmittance, decrease in light extraction efficiency can be suppressed even when the layer having the mixture material is thickened. Thereby, optimization of a film thickness of the layer having the mixture material can be achieved so that increase in the drive voltage can be suppressed and the light extraction efficiency to outside can be increased.

Further, since a short circuit due to dust, impact, or the like can be prevented by thickening the layer having the mixture material, a light emitting element with high reliability can be obtained. For example, a thickness between electrodes of a typical light emitting element is 100 to 150 nm, whereas a thickness between electrodes of the light emitting element using the layer containing the mixture material can be 100 to 500 nm, preferably, 200 to 500 nm.

In addition, the layer having the mixture material to be used for the light emitting element of the present invention can form an ohmic contact with an electrode, and has low contact resistance with the electrode. Therefore, an electrode material can be selected without considering a work function or the like. In other words, the electrode material can be selected from a wider range of materials.

Embodiment Mode 3

In this embodiment mode, a light emitting element having a structure different from that described in Embodiment Mode 2 is explained with reference to FIGS. 8A to 8C and 9A to 9C. In a structure to be described in this embodiment mode, a layer having the mixture material of the present invention can be provided to be in contact with an electrode serving as a cathode.

Figure 8A:
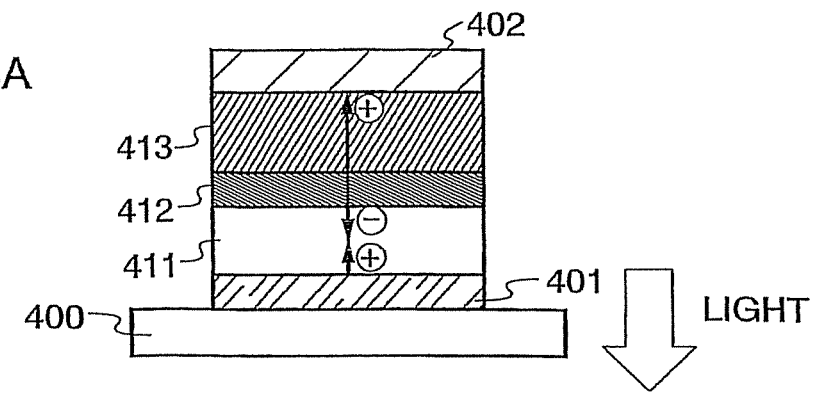
FIGS. 8A to 8C are views for explaining a light emitting element of the present invention.

An example of a structure of a light emitting element of the present invention is shown in FIG. 8A. In the structure, a first layer 411, a second layer 412, and a third layer 413 are stacked between a first electrode 401 and a second electrode 402. In this embodiment mode, the case where the first electrode 401 serves as an anode and the second electrode 402 serves as a cathode is explained.

The first electrode 401 and the second electrode 402 can have the same structures as that described in Embodiment Mode 2. The first layer 411 is a layer which contains a material having a high light emission property. The second layer 412 is a layer which contains both a compound selected from electron donating materials and a compound having a high electron transport property, and the third layer 413 is a layer which contains the mixture material described in Embodiment Mode 1. The electron donating material contained in the second layer 412 is preferably an alkali metal, an alkaline earth metal, or oxide or salt thereof. Specifically, lithium, cesium, calcium, lithium oxide, calcium oxide, barium oxide, cesium carbonate, or the like can be given.

With such a foregoing structure, as shown in FIG. 8A, electrons are donated and accepted in the vicinity of the interface between the second layer 412 and the third layer 413 by applying a voltage; thereby electrons and holes are generated. The second layer 412 transports the electrons to the first layer 411 while the third layer 413 transports the holes to the second electrode 402. In other words, the second layer 412 and the third layer 413 collectively serve as a carrier generation layer. Further, it can be said that the third layer 413 has a function of transporting holes to the second electrode 402.

In addition, the third layer 413 exhibits an extremely high hole injection property and hole transport property. Therefore, drive voltage can be lowered. In addition, when the third layer 413 is thickened, increase in the drive voltage can be suppressed.

In addition, even when the third layer 413 is thickened, increase in the drive voltage can be suppressed. Thus, the thickness of the third layer 413 can be freely set, and extraction efficiency of light emission from the first layer 411 can be improved. In addition, the thickness of the third layer 413 can be set so that color purity of the light emission from the first layer 411 is improved. In addition, the third layer 413 has a high visible light transmittance, which can suppress reduction in external extinction efficiency of light emission due to thickening the film thickness of the third layer 413.

It is to be noted that the light emitting element of this embodiment mode also has different variations by changing materials for the first electrode 401 and the second electrode 402. Schematic diagrams thereof are shown in FIGS. 8B, 8C, and 9A to 9C. It is to be noted that reference numerals in FIG. 8A are also used in FIGS. 8B, 8C, and 9A to 9C, and reference numeral 400 denotes a substrate for supporting the light emitting element of the present invention.

Figure 8B:
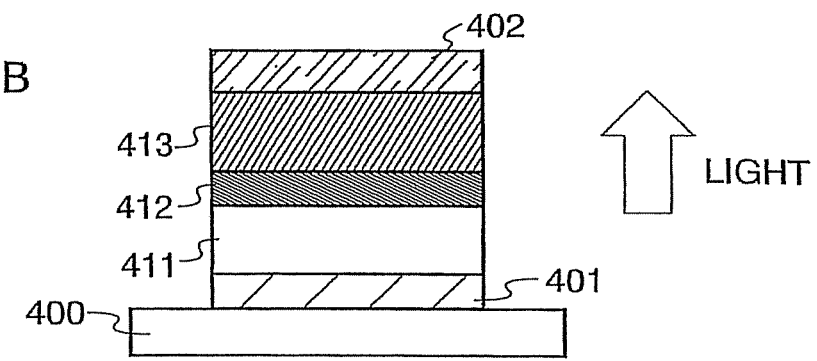
Figure 8C:
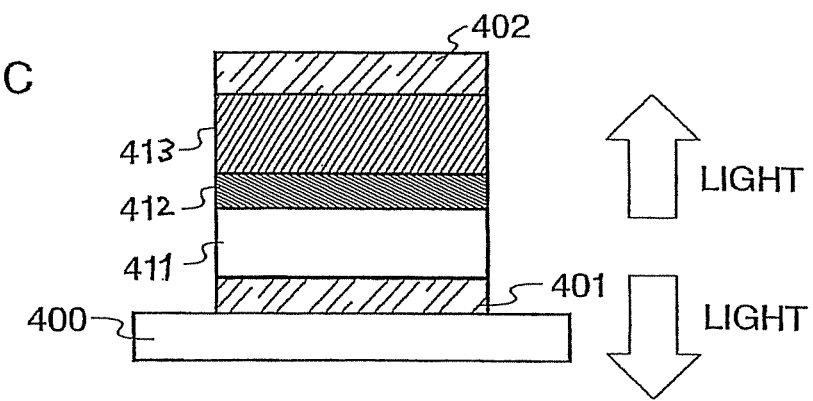

FIGS. 8A to 8C show examples of the case where the first layer 411, the second layer 412, and the third layer 413 are sequentially stacked over the substrate 400. In these examples, when the first electrode 401 has a light transmission property and the second electrode 402 has a light blocking property (in particular, reflectivity), light is extracted from the substrate 400 side as shown in FIG. 8A. When the first electrode 401 has a light blocking property (in particular, reflectivity) and the second electrode 402 has a light transmission property, light is extracted from the side opposite to the substrate 400 as shown in FIG. 8B. Further, when both the first electrode 401 and the second electrode 402 have light transmission properties, light can be extracted from both the substrate 400 side and the side opposite to the substrate 400 as shown in FIG. 8C.

Figure 9A:
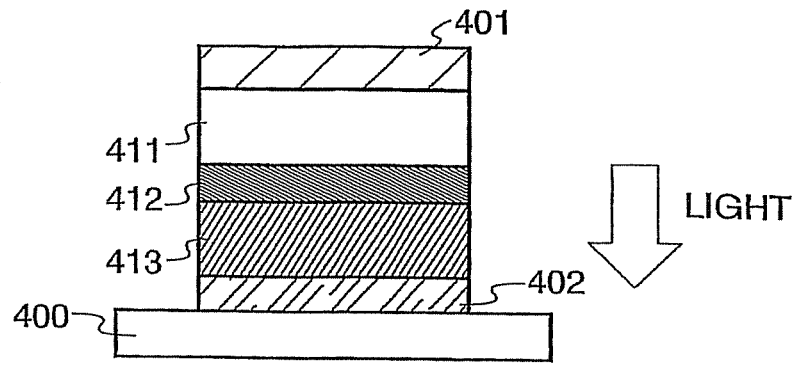
FIGS. 9A to 9C are views for explaining a light emitting element of the present invention.
Figure 9B:
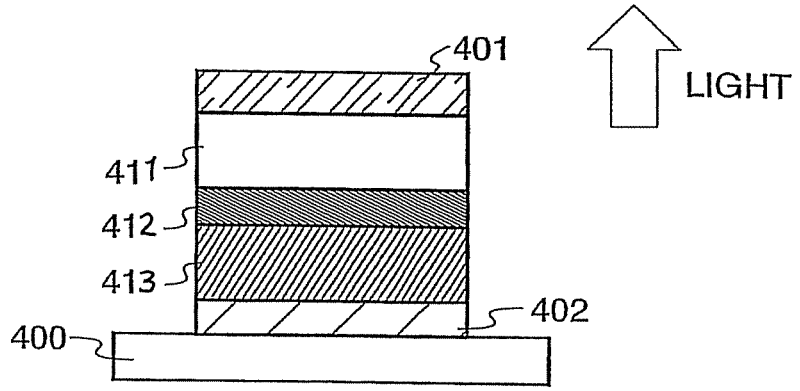
Figure 9C:
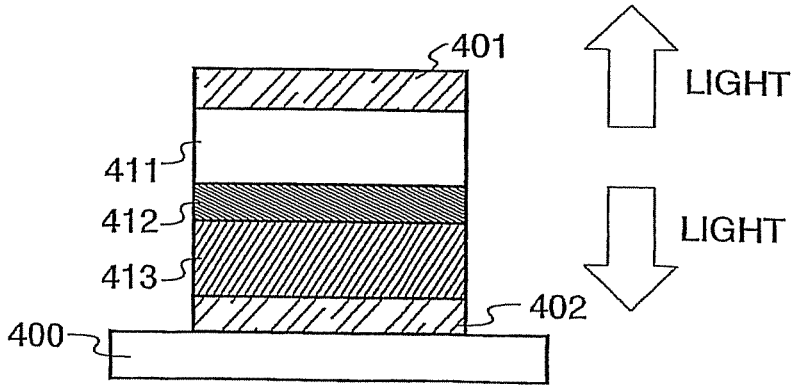

FIGS. 9A to 9C show examples of the case where the third layer 413, the second layer 412, and the first layer 411 are sequentially stacked over the substrate 400. In these examples, when the first electrode 401 has a light blocking property (in particular, reflectivity) and the second electrode 402 has a light transmission property, light is extracted from the substrate 400 side as shown in FIG. 9A. When the first electrode 401 has a light transmission property and the second electrode 402 has a light blocking property (in particular, reflectivity), light is extracted from the side opposite to the substrate 400 as shown in FIG. 9B. Further, when both the first electrode 401 and the second electrode 402 have light transmission properties, light can be extracted from both the substrate 400 side and the side opposite to the substrate 400 as shown in FIG. 9C.

As shown in FIGS. 8A to 8C, the first layer 411, the second layer 412, and the third layer 413 may be sequentially stacked after forming the first electrode 401, and then, the second electrode 402 may be formed. Alternatively, as shown in FIGS. 9A to 9C, the third layer 413, the second layer 412, and the first layer 411 may be sequentially stacked after forming the second electrode 402, and then, the first electrode 401 may be formed.

It is to be noted that this embodiment mode can be appropriately combined with another embodiment mode.

Embodiment Mode 4

In this embodiment mode, a light emitting element having a structure different from those described in Embodiment Modes 2 and 3 is explained with reference to FIGS. 3A to 3C and 4A to 4C. In a structure to be described in this embodiment mode, layers having the mixture material of the present invention can be provided to be separately in contact with two electrodes of the light emitting element.

Figure 3A:
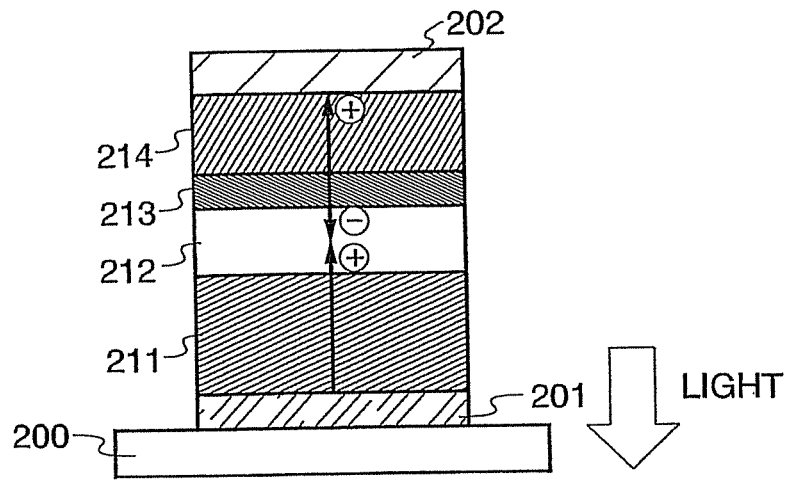
FIGS. 3A to 3C are views for explaining a light emitting element of the present invention.

An example of a structure of the light emitting element of the present invention is shown in FIG. 3A. In the structure, a first layer 211, a second layer 212, a third layer 213, and a fourth layer 214 are stacked between a first electrode 201 and a second electrode 202. In this embodiment mode, the case where the first electrode 201 serves as an anode and the second electrode 202 serves as a cathode is explained.

The first electrode 201 and the second electrode 202 can employ the same structure as that described in Embodiment Mode 2. The first layer 211 is a layer containing the mixture material described in Embodiment Mode 1, and the second layer 212 is a layer containing a material having a high light emission property. The third layer 213 is a layer containing both an electron donating material and a compound having a high electron transport property, and the fourth layer 214 is a layer containing the mixture material described in Embodiment Mode 1. The electron donating material contained in the third layer 213 is preferably an alkali metal or an alkaline earth metal, or oxide or salt thereof. Specifically, lithium, cesium, calcium, lithium oxide, calcium oxide, barium oxide, cesium carbonate, or the like can be given.

With such a structure described above, as shown in FIG. 3A, electrons are donated and accepted in the vicinity of the interface between the third layer 213 and the fourth layer 214 by applying a voltage; thereby electrons and holes are generated. The third layer 213 transports the electrons to the second layer 212 while the fourth layer 214 transports the holes to the second electrode 202. In other words, the third layer 213 and the fourth layer 214 collectively serve as a carrier generation layer. Further, it can be said that the fourth layer 214 has a function of transporting the holes to the second electrode 202. It is to be noted that a tandem light emitting element can also be formed by additionally stacking the second layer and the third layer between the fourth layer 214 and the second electrode 202.

In addition, the first layer 211 and the fourth layer 214 exhibit an extremely high hole injection property and hole transport property. Therefore, drive voltage of the light emitting element can be lowered. In addition, when the first layer 211 and the fourth layer 214 are thickened, increase in drive voltage can be suppressed.

In addition, even when the first layer 211 and the fourth layer 214 are thickened, an increase in drive voltage can be suppressed. Thus, the thicknesses of the first layer 211 and the fourth layer 214 can be freely set, and extraction efficiency of light emission from the second layer 212 can be improved. In addition, the thicknesses of the first layer 211 and the fourth layer 214 can be set so that color purity of light emission from the second layer 212 is improved. Further, the first layer 211 and the fourth layer 214 have a high visible light transmittance, which can suppress reduction in external extraction efficiency of light emission due to thickening the film thicknesses of the first layer 211 and the fourth layer 214.

Further, in the light emitting element of this embodiment mode, the layer provided between the second layer having a function of emitting light and the anode and the layer provided between the second layer and the cathode can be made extremely thick, thereby a short circuit of the light emitting element can be prevented effectively. Further, since layers formed from the same material can be provided to sandwich the layer having a function of emitting light by forming the first layer 211 and the fourth layer 214 from the same material, an effect of suppressing stress distortion can also be expected.

It is to be noted that the light emitting element of this embodiment mode also has different variations by changing materials for the first electrode 201 and the second electrode 202. Schematic diagrams thereof are shown in FIGS. 3B, 3C, and 4A to 4C. It is to be noted that reference numerals in FIG. 3A are also used in FIGS. 3B, 3C, and 4A to 4C, and reference numeral 200 denotes a substrate for supporting the light emitting element of the present invention.

Figure 3B:
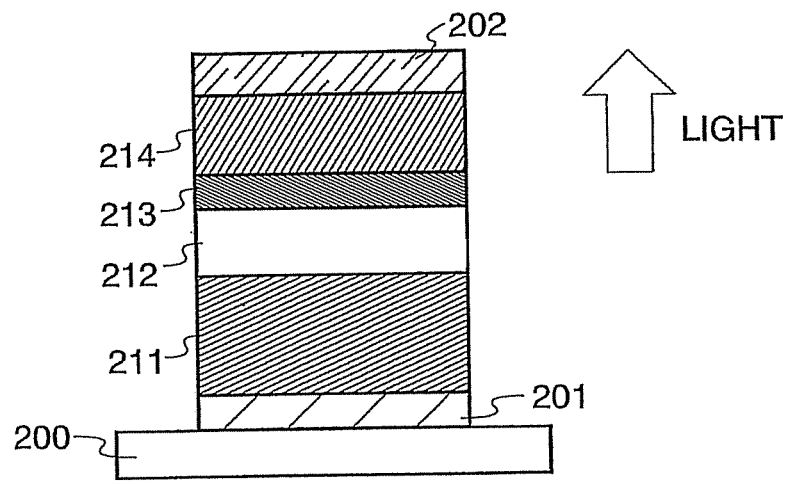
Figure 3C:
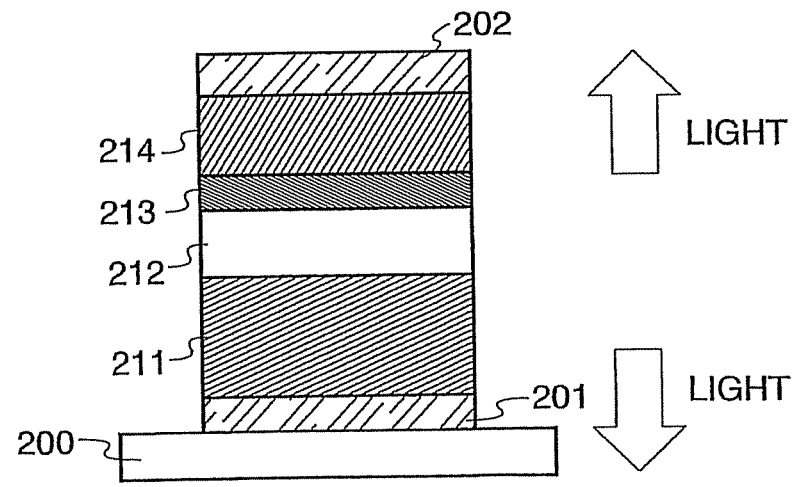

FIGS. 3A to 3C show examples of the case where the first layer 211, the second layer 212, the third layer 213, and the fourth layer 214 are sequentially stacked over the substrate 200. In these examples, when the first electrode 201 has a light transmission property and the second electrode 202 has a light blocking property (in particular, reflectivity), light is extracted from the substrate 200 side as shown in FIG. 3A. When the first electrode 201 has a light blocking property (in particular, reflectivity) and the second electrode 202 has a light transmission property, light is extracted from the side opposite to the substrate 200 as shown in FIG. 3B. Further, when both the first electrode 201 and the second electrode 202 have light transmission properties, light can be extracted from both the substrate 200 side and the side opposite to the substrate 200 as shown in FIG. 3C.

Figure 4A:
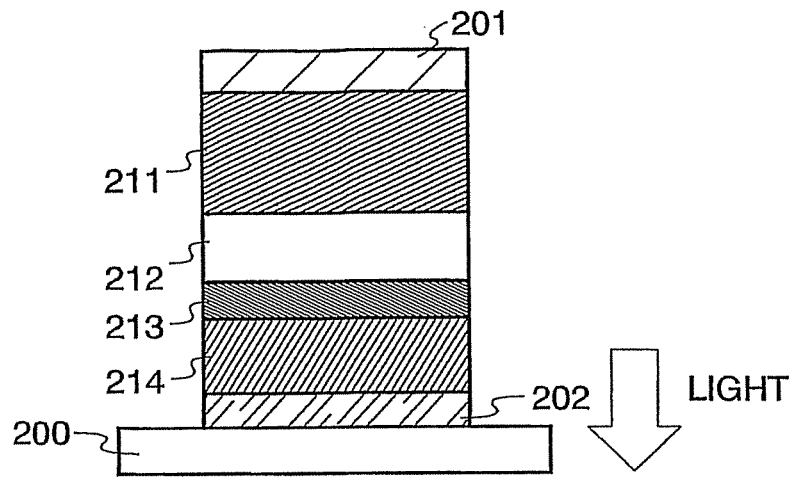
FIGS. 4A to 4C are views for explaining a light emitting element of the present invention.
Figure 4B:
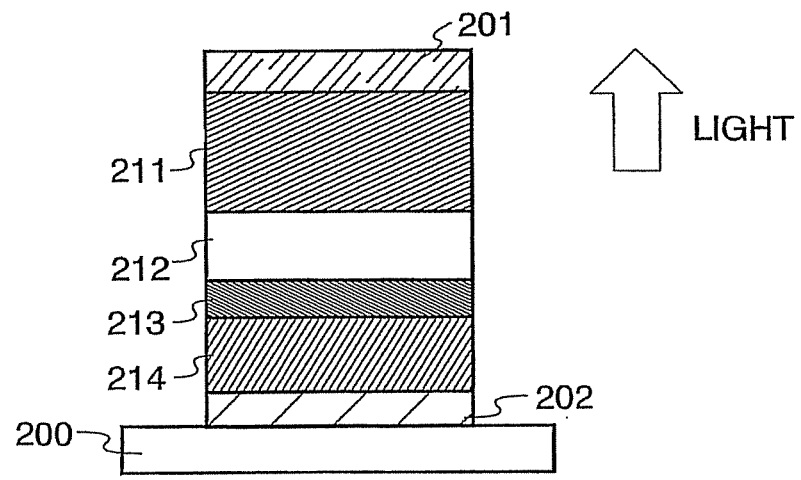
Figure 4C:
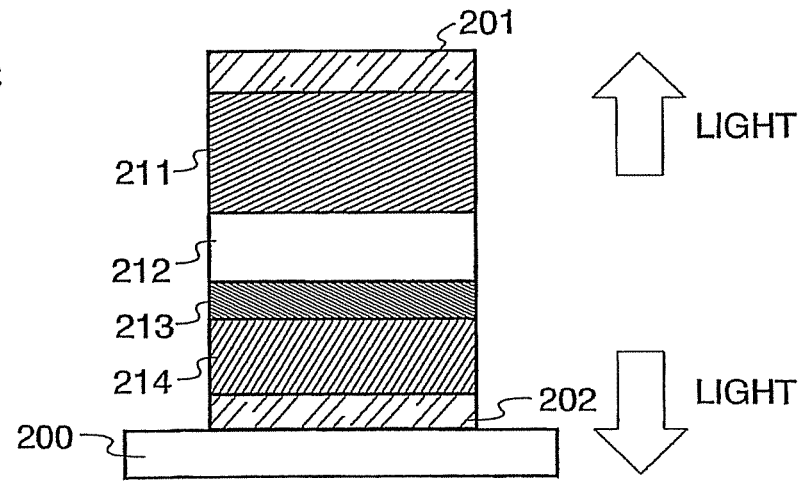

FIGS. 4A to 4C show examples of the case where the fourth layer 214, the third layer 213, the second layer 212, and the first layer 211 are sequentially stacked over the substrate 200. In these examples, when the first electrode 201 has a light blocking property (in particular, reflectivity) and the second electrode 202 has a light transmission property, light is extracted from the substrate 200 side as shown in FIG. 4A. In addition, when the first electrode 201 has a light transmission property and the second electrode 202 has a light blocking property (in particular, reflectivity), light is extracted from the side opposite to the substrate 200 as shown in FIG. 4B. Further, when both the first electrode 201 and the second electrode 202 have light transmission properties, light can be extracted from both the substrate 200 side and the side opposite to the substrate 200 as shown in FIG. 4C.

It is to be noted that another structure can also be employed in which the first layer 211 contains both one compound selected from electron donating materials and a compound having a high electron transport property; the second layer 212 contains a light emitting material, the third layer 213 is a layer containing the mixture material described in Embodiment Mode 1, and the fourth layer 214 contains both one compound selected from electron donating materials and a compound having a high electron transport property.

It is to be noted that various methods of both a wet method and a dry method can be employed when manufacturing the light emitting element of this embodiment mode.

As shown in FIGS. 3A to 3C, the first layer 211, the second layer 212, the third layer 213, and the fourth layer 214 may be sequentially stacked after forming the first electrode 201, and then, the second electrode 202 may be formed. Alternatively, as shown in FIGS. 4A to 4C, the fourth layer 214, the third layer 213, the second layer 212, and the first layer 211 may be sequentially stacked after forming the second electrode 202, and then, the first electrode may be formed.

It is to be noted that this embodiment mode can be appropriately combined with another embodiment mode.

Embodiment Mode 5

In this embodiment mode, an optical design of a light emitting element is explained.

In each of the light emitting elements described in Embodiment Modes 2 to 4, light extraction efficiency of each emission color can be improved by differentiating a thickness of at least one of the layers except the first electrode and the second electrode among light emitting elements which emit each emission color.

For example, as shown in FIG. 10, light emitting elements which individually emit light of red (R), green (G), and blue (B) share a first electrode 1101 that is a reflective electrode and a second electrode 1102 having a light transmission property, and have first layers 1111R, 1111G, and 1111B; second layers 1112R, 1112Q and 1112B; third layers 1113R, 1113G and 1113B; and fourth layers 1114R, 1114G and 1114B, respectively. Then, thicknesses of the first layers 1111R, 1111G, and 1111B are differentiated for each emission color.

It is to be noted that in each of the light emitting elements shown in FIG. 10, when a voltage is applied so that a potential of the first electrode 1101 becomes higher than that of the second electrode 1102, holes are injected from the first layer 1111 to the second layer 1112. Electrons are donated and accepted in the vicinity of the interface between the third layer 1113 and the fourth layer 1114; thereby electrons and holes are generated. The third layer 1113 transports the electrons to the second layer 1112 while the fourth layer 1114 transports the holes to the second electrode 1102. The holes and the electrons are recombined in the second layer 1112 to excite a light emitting material. Then, the excited light emitting material emits light when returning to a ground state.

As shown in FIG. 10, by differentiating thicknesses of the first layers 1111R, 1111G, and 1111B for each emission color, decrease in light extraction efficiency can be prevented which is caused by a difference in light path between the case of recognizing light directly through the second electrode and the case of recognizing light reflected by the first electrode through the second electrode.

Specifically, when light enters the first electrode, phase reversal occurs in the reflected light, thereby a light interference effect is produced. Consequently, in the case where an optical distance between a light emitting region and a reflecting electrode (i.e., refractive index×distance) is the emission wavelength multiplied by $(2m-1)/4$ (m is a given positive integer) or $m = 1/4, 3/4, 5/4 \ldots$ of the emission wavelength, the external extraction efficiency of light emission is increased. In the meanwhile, in the case where the optical distance is the emission wavelength multiplied by $m/2$ (m is a given positive integer) or $m = 1/2, 1, 3/2 \ldots$ of the emission wavelength, the external extraction efficiency of light emission is decreased.

Therefore, among light emitting elements of the present invention, thicknesses of any of the first to fourth layers are differentiated so that the optical distance between the light emitting region and the reflecting electrode (i.e., refractive index×distance) is the emission wavelength multiplied by $(2m-1)/4$ (m is a given positive integer).

In particular, in the first to fourth layers, a thickness of the layer between the layer in which electrons and holes are recombined and the reflecting electrode are preferably differentiated. Alternatively, a thickness of the layer between the layer in which electrons and holes are recombined and the light transmitting electrode may be differentiated. Further alternatively, thicknesses of both of the layers may be differentiated. Consequently, light can be extracted outside efficiently.

In order to differentiate a thickness of any of the first to fourth layers, the layer needs to be thickened. One feature of the light emitting element of the present invention is that a layer having the mixture material described in Embodiment Mode 1 is used for the layer to be thickened.

Generally, it is not preferable to thicken a layer of a light emitting element, since drive voltage thereof is increased. However, by using the mixture material described in Embodiment Mode 1 for the layer to be thickened, the drive voltage itself can be reduced, which can suppress increase in the drive voltage due to thickening the layer.

It is to be noted that FIG. 10 shows the case where an optical distance between the light emitting region and the reflecting electrode of the light emitting element of red (R) is ¼ of an emission wavelength, an optical distance between the light emitting region and the reflecting electrode of the light emitting element of green (G) is ¾ of the emission wavelength, and an optical distance between the light emitting region and the reflecting electrode of the light emitting element of blue (B) is ⅝ of the emission wavelength. It is to be noted that the present invention is not restricted to these values, and the value of m can be appropriately set. As shown in FIG. 10, the value of m in (2m−1)/4 of the emission wavelength may be different among the light emitting elements.

By thickening any of the first to fourth layers, a short circuit between the first and second electrodes can be prevented and productivity can be improved, which is extremely preferable.

As described above, thicknesses of at least any one the first to fourth layers in the light emitting element of the present invention can be differentiated for each emission color. At this time, thickness of the layer between the layer in which electrons and holes are recombined and the reflecting electrode is preferably differentiated for each emission color. If a layer having the mixture material described in Embodiment Mode 1 is used for the layer which needs to be thickened, drive voltage is not increased, which is preferable.

It is to be noted that this embodiment mode is explained using the light emitting element having the structure described in Embodiment Mode 4, but it can be appropriately combined with another embodiment mode.

Embodiment Mode 6

In this embodiment mode, a light emitting device having a light emitting element of the present invention is explained.

A light emitting device having a light emitting element of the present invention in a pixel portion is explained in this embodiment mode with reference to FIGS. 5A and 5B. It is to be noted that FIG. 5A is a top view showing the light emitting device and FIG. 5B is a cross-sectional view of FIG. 5A taken along lines A-A' and B-B'. Reference numeral 601 indicated by a dashed line denotes a driver circuit portion (a source side driver circuit); 602, a pixel portion; and 603, a driver circuit portion (a gate side driver circuit). Reference numeral 604 denotes a sealing substrate; 605, a sealant; and a portion surrounded by the sealant 605 is a space 607.

It is to be noted that a lead wire 608 is a wire for transmitting a signal to be inputted to the source side driver circuit 601 and the gate side driver circuit 603 and receives a video signal, a clock signal, a start signal, a reset signal, or the like from an FPC (flexible printed circuit) 609 that is an external input terminal. It is to be noted that although only the PVC is shown here, the FPC may be provided with a printed wiring board (PWB). The light emitting device in this specification includes not only a light emitting device itself but also a light emitting device with an FPC or a PWB attached.

A cross-sectional structure is explained with reference to FIG. 5B. The driver circuit portion and the pixel portion are formed over an element substrate 610. Here, the source side driver circuit 601 which is the driver circuit portion and one pixel in the pixel portion 602 are shown.

It is to be noted that a CMOS circuit which is a combination of an n-channel TFT 623 and a p-channel TFT 624 is faulted as the source side driver circuit 601. A TFT for forming the driver circuit may be formed using a CMOS circuit, a PMOS circuit, or an NMOS circuit. A driver integration type in which a driver circuit is formed over a substrate is described in this embodiment mode, but it is not necessarily required and the driver circuit can be formed outside the substrate.

The pixel portion 602 has a plurality of pixels, each of which includes a switching TFT 611, a current control TFT 612, and a first electrode 613 which is electrically connected to a drain of the current control TFT 612. It is to be noted that an insulator 614 is formed to cover an end of the first electrode 613. Here, a positive type photosensitive acrylic resin film is used.

The insulator 614 is formed to have a curved surface at an upper end or a lower end thereof in order to make the coverage favorable. For example, in the case of using positive type photosensitive acrylic as a material of the insulator 614, the insulator 614 is preferably formed to have a curved surface with a curvature radius (0.2 to 3 μm) only at an upper end. Either a negative type which becomes insoluble in an etchant by light irradiation or a positive type which becomes soluble in an etchant by light irradiation can be used as the insulator 614.

A laminated body 616 including a layer containing the mixture material described in Embodiment Mode 1 and a layer containing a light emitting material, and a second electrode 617 are formed over the first electrode 613. Here, a material having a high work function is preferably used as a material for the first electrode 613 which serves as an anode. For example, the first electrode 613 can be formed by using a single-layer film such as an ITO film, an indium tin oxide film containing silicon, an indium oxide film containing zinc oxide at 2 to 20 wt %, a titanium nitride film, a chromium film, a tungsten film, a Zn film, or a Pt film; a laminated layer of a titanium nitride film and a film containing aluminum as its main component; a three-layer structure of a titanium nitride film, a film containing aluminum as its main component, and another titanium nitride film; or the like. When the first electrode 613 has a laminated structure, it can have low resistance as a wire and can form a favorable ohmic contact. In addition, the first electrode 613 can function as an anode.

The layer having the mixture material described in Embodiment Mode 1 is a layer which contains a conductive material formed from an inorganic compound and an insulating material formed from an inorganic compound and a resistivity of the layer is preferably $5 \times 10^4$ to $1 \times 10^6$ Ω·cm, more preferably, $2 \times 10^5$ to $5 \times 10^5$ Ω·cm.

In addition, the layer containing a light emitting material is formed by a known method such as a vapor deposition method using a vapor deposition mask, an ink jet method, and a spin coating method. As a material for the layer containing a light emitting material, a low molecular material, an intermediate molecular material (including an oligomer and a dendrimer), or a high molecular material may be used. In addition, as a material used for the layer containing the light emitting material, a single layer or a laminated layer of an organic compound is generally used. However, in the present invention, a structure in which an inorganic compound is used for a part of a film formed from an organic compound is also included.

As a material used for the second electrode 617 which is formed over the laminated body 616 including the layer containing the mixture material and the layer containing the light emitting material, and which serves as a cathode, a material having a low work function (Al, Ag, Li, Ca, or an alloy thereof such as MgAg, MgIn, AlLi, CaF$_2$, lithium fluoride, or calcium nitride) is preferably used. In the case where light generated in the laminated body 616 is transmitted through the second electrode 617, a laminated layer of a metal thin film with a thin thickness and a transparent conductive film (a film of ITO, indium oxide containing zinc oxide at 2 to 20 wt %, indium tin oxide containing silicon, zinc oxide (ZnO), or the like) is preferably used as the second electrode 617.

By attaching the sealing substrate 604 to the element substrate 610 with the sealant 605, a light emitting element 618 is provided in the space 607 surrounded by the element substrate 610, the sealing substrate 604, and the sealant 605. It is to be noted that the space 607 may be filled with an inert gas (such as nitrogen or argon) or may be filled with the sealant 605.

It is to be noted that an epoxy-based resin is preferably used as the sealant 605. In addition, a material for the sealant 605 preferably allows as little moisture and oxygen as possible to penetrate. As the sealing substrate 604, a plastic substrate formed of FRP (Fiberglass-Reinforced Plastics), PVF (polyvinyl fluoride), Myler, polyester, acrylic, or the like can be used besides a glass substrate or a quartz substrate.

A light emitting device having the light emitting element of the present invention can be formed as described above.

Since the light emitting device of the present invention includes a layer having the mixture material which contains a conductive material and an insulating material and a resistivity of the layer is preferably $5\times10^4$ to $1\times10^6$ Ω·cm, more preferably, $2\times10^5$ to $5\times10^5$ Ω·cm, reduction in drive voltage and power consumption can be achieved.

In addition, since the mixture material to be used in the present invention has a high visible light transmittance, light emitted from the light emitting layer can be extracted outside efficiently.

In addition, the light emitting device of the present invention can suppress increase in drive voltage even when the layer having the mixture material containing a conductive material and an insulating material is thickened. In addition, the composite material used in the present invention has a high visible light transmittance. Therefore, a short circuit of the light emitting element can be prevented by thickening the layer having the mixture material. In addition, improvement in external extraction efficiency of light emission can be achieved by optical design. Therefore, a reliable light emitting device with low power consumption can be obtained.

Figure 6:
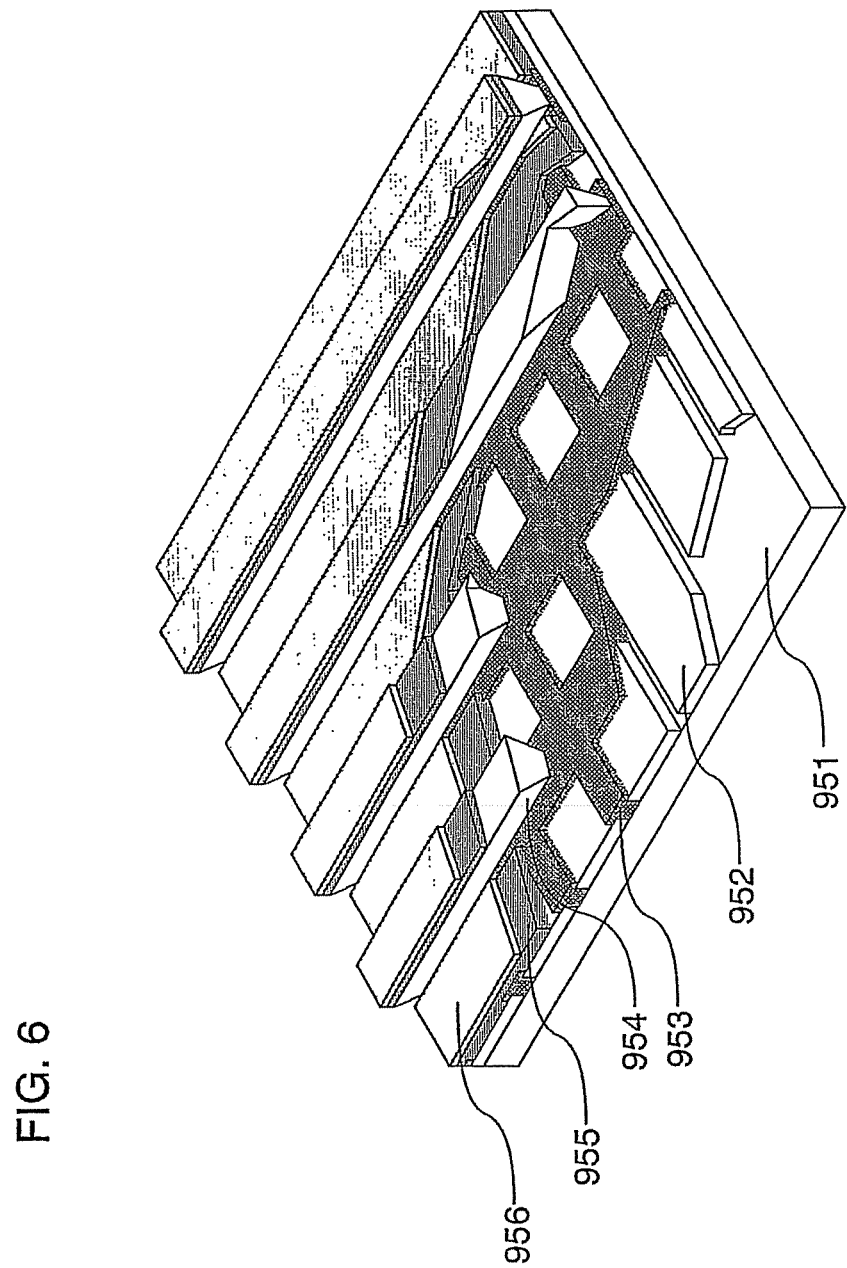
FIG. 6 is a view for explaining a light emitting device of the present invention.

As described above, an active matrix light emitting device in which drive of a light emitting element is controlled by a transistor is explained in this embodiment mode. However, a passive matrix light emitting device in which the light emitting element is driven without a driving element such as a transistor particularly provided may also be employed. FIG. 6 shows a perspective view of a passive matrix light emitting device which is manufactured by applying the present invention. In FIG. 6, a laminated body 955 including a layer containing a light emitting material and a layer containing the mixture material described in Embodiment Mode 1 is provided between an electrode 952 and an electrode 956 over a substrate 951. An edge portion of the electrode 952 is covered with an insulating layer 953. Then, a partition layer 954 is provided over the insulating layer 953. A side wall of the partition layer 954 slopes so that a distance between one side wall and the other side wall becomes narrow toward a substrate surface. In other words, a cross section of the partition layer 954 in the direction of a narrow side is trapezoidal, and a bottom side (a side facing the same direction as a plane direction of the insulating layer 953 and in contact with the insulating layer 953) is shorter than an upper side (a side facing in the same direction as the plane direction of the insulating layer 953 and not in contact with the insulating layer 953). A defect of the light emitting element due to static electricity or the like can be prevented by providing the partition layer 954 in this manner. In addition, the passive light emitting device can also be driven with low power consumption when it has the light emitting element of the present invention which operates at low drive voltage.

Embodiment Mode 7

In this embodiment mode, an example of a light emitting device having a light emitting element and a transistor for controlling the operation of the light emitting element is described with reference to FIG. 11.

Figure 11:
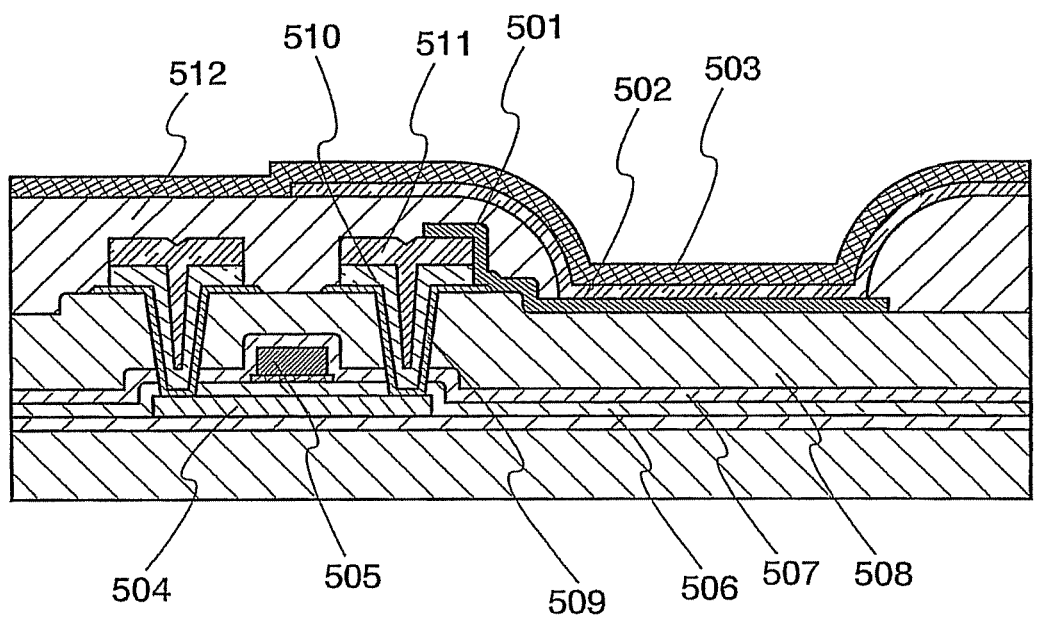
FIG. 11 is a view of an example of a light emitting element and a light emitting device which has a transistor for controlling an operation of the light emitting element.

In FIG. 11, the light emitting element has a structure in which a laminated body 502 is interposed between a first electrode 501 and a second electrode 503. The laminated body 502 has a layer containing a light emitting material and a layer containing the mixture material, which are described in detail in Embodiment Modes 1 to 5. A peripheral edge portion of the first electrode is covered with a partition layer 512 formed from an insulating organic resin material or an insulating inorganic material. The laminated body 502 and the second electrode 503 are formed in an opening portion of the partition layer 512, that is, an exposed portion of the first electrode 501, thereby the structure of the light emitting element in the light emitting device is formed.

The transistor for controlling the operation of the light emitting element has a semiconductor layer 504, and a gate electrode 505 which is overlapped with the semiconductor layer via a gate insulating layer 506. The gate electrode 505 may be formed from a metal such as tungsten, molybdenum, titanium, and tantalum. A conductive layer which is formed from oxide or nitride of the foregoing metals may be provided in a lower portion of the layer formed from the metal.

The light emitting element and the transistor are connected to each other by a wire which penetrates the gate insulating layer 506, a first interlayer insulating layer 507, and a second interlayer insulating layer 508. The wire connects elements electrically and preferably has low resistance. When aluminum is used as an electrode, there arises a problem that favorable contact cannot be formed due to increase in contact resistance when the surface of aluminum is oxidized. In this embodiment mode, there is a possibility that a surface of aluminum is oxidized and contact resistance is increased due to electrical erosion, when ITO is used for the first electrode of the Light emitting element.

Therefore, the light emitting device of this embodiment mode has a wire formed of a first conductive layer 509 and a second conductive layer 510. The first conductive layer 509 is formed from a conductive material which is conductive even when oxidized or a material which is not oxidized. Specifically, a metal such as titanium, tantalum, tungsten, chromium, nickel, and molybdenum; or nitride or oxide thereof is used. In addition, the second conductive layer 510 is formed from aluminum, or an alloy or a compound containing aluminum. An insulating layer 511 is formed over the second conductive layer 510. The insulating layer 511 is provided for preventing oxidation or corrosion of the surface of the second conductive layer 510. As a material for the insulating layer 511, a material which is hard to react with the second conductive layer 510 is preferable; for example, an organic resin material such as a photoresist, polyimide, acryl, and the like; or an inorganic insulating material such as silicon nitride, silicon oxide, and the like can be used.

The wire is formed so that a width of the first conductive layer 509 is wider than that of the second conductive layer 510. That is, the first conductive layer 509 extends out of from the second conductive layer 510. The cross sectional shape of the wire can be seen as a hat with a brim (hat-shape). In a connection portion with the light emitting element, the first electrode 501 is in contact with the side end portion of the first conductive layer 509 and a portion of a top surface of the first conductive layer 509 which extends out of the second conductive layer 510. The first electrode 501 is extended to the side surface of the second conductive layer 510 and the side surface of the insulating layer 511 to reach the top surface of the insulating layer 511. Thus, the first electrode 501 is in contact with at least the first conductive layer 509 to form electrical connection. In such a structure, the wire and the light emitting element can be electrically connected even when the surface of aluminum is oxidized.

As a material for the first electrode 501, in addition to ITO, indium tin oxide containing silicon (ITSO), indium oxide containing zinc oxide (ZnO) at 2 to 20 wt % (IZO), zinc oxide doped with gallium (GZO) and a conductive material of iridium oxide doped with titanium oxide (ITiO), zinc oxide doped with titanium oxide (ZnTiO), and the like can be used. In any case, the first electrode 501 preferably has an element or compound which inhibits crystallization of indium oxide or zinc oxide so that the surface of the first electrode 501 is planarized.

When titanium oxide is contained in indium oxide or zinc oxide, a wettability of a surface can be improved. Therefore, when the laminated body 502 is formed by a wet method which utilizes an ink jet printing technique or a spin coating technique, indium oxide or zinc oxide containing titanium oxide is preferably used. In addition, when the first electrode 501 is formed by a sputtering method using indium oxide as a target, abnormal electrical discharge can be suppressed because titanium oxide is conductive, thereby powder contamination in a film forming step and a generation of pinhole in the first electrode 501 can be suppressed. In such a case, a target of indium oxide preferably contains titanium oxide at 1 to 20 wt %, more preferably, at 3 to 10 wt %.

It is to be noted that although this embodiment mode shows an example in which a two-layer structure including the first conductive layer 509 and the second conductive layer 510 is used as a structure of the wire, the structure of the wire is not restricted thereto. A wire having a similar function may be formed with a laminated structure including a plurality of layers by combining a layer containing a conductive material with low resistance and a layer containing a conductive material which is conductive even when oxidized or a layer containing a conductive material which is not oxidized.

Figure 12:
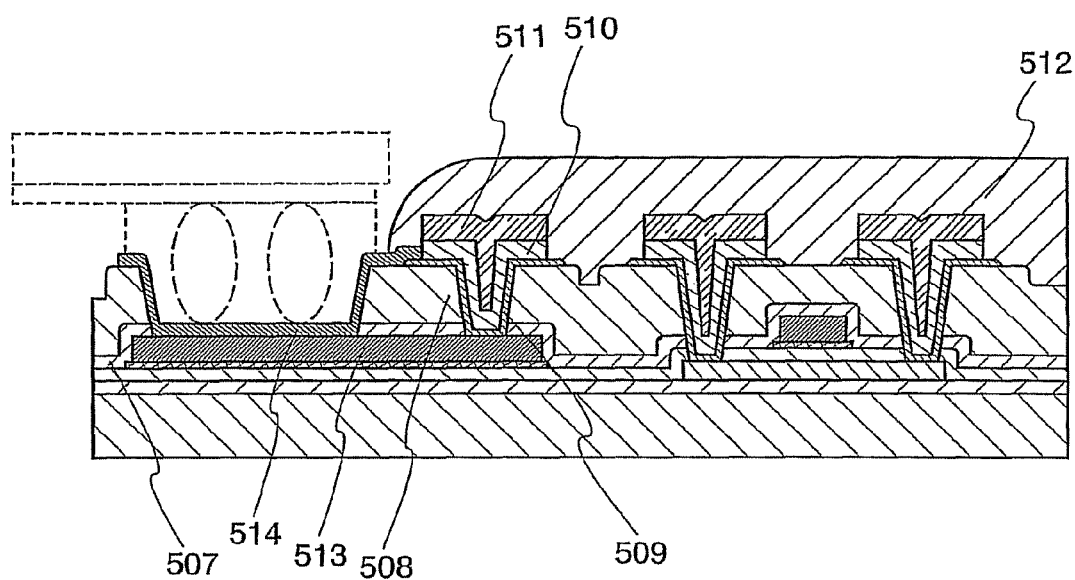
FIG. 12 is a view of an example of a connecting terminal portion in a light emitting device having a light emitting element and a transistor for controlling an operation of the light emitting element.

FIG. 12 shows a structure of an input terminal portion of the light emitting device. A connection terminal 513 for connecting an external circuit is formed from the same conductive material as the gate electrode 505. The connection terminal 513 is exposed in an opening portion where a first interlayer insulating layer 507 and a second interlayer insulating layer 508 are removed. A conductive layer 514 which is formed from the same conductive material as the first electrode 501 is formed over an exposed surface of the connection terminal 513 so as to cover the exposed surface for protection. In addition, the connection terminal may be provided so as to be connected to a wire formed of the first conductive layer 509 and the second conductive layer 510. The insulating layer 511 is formed over the second conductive layer 510.

As described above, according to the light emitting device of this embodiment mode, lower power consumption of the light emitting device can be realized by applying a wire with which a light emitting element having a layer having a light emitting material and a layer having the mixture material containing a conductive material formed from an inorganic compound and an insulating material formed from an inorganic compound, and a transistor for controlling an operation of the light emitting element can be electrically connected preferably. That is, by providing a layer having the mixture material in the light emitting element, reduction in drive voltage of the light emitting element can be realized. In addition, since increase in the contact resistance of the electrode and the wire in the light emitting element can be suppressed, further reduction in power consumption is possible.

Embodiment Mode 8

In this embodiment mode, examples of electric appliances according to the present invention are described with reference to FIGS. 7A to 7E.

Figure 7A:
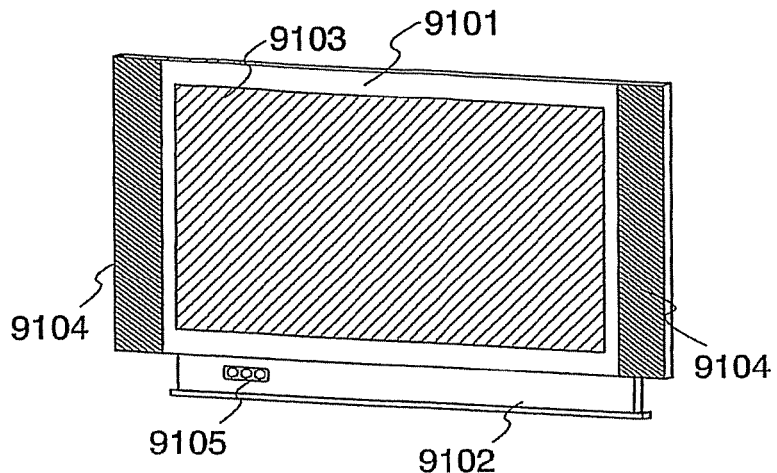
FIGS. 7A to 7E are views for explaining electric appliances having a light emitting device of the present invention.

FIG. 7A shows a television device according to the present invention which includes a chassis 9101, a support 9102, a display portion 9103, a speaker portion 9104, a video input terminal 9105, and the like. In the television device, the display portion 9103 has a plurality of light emitting elements, which are similar to those described in Embodiment Modes 2 to 5, arranged in matrix. One feature of the light emitting element is that external extraction efficiency of light is high and a short circuit thereof due to dust, impact, or the like can be prevented. The display portion 9103 which includes the light emitting elements has a similar feature. Therefore, in the television device, image quality is hardly deteriorated and low power consumption can be achieved. With such a feature, a deterioration compensation function and a power source circuit can be significantly removed or reduced, thereby reduction in size and weight of the chassis 9101 and the support 9102 can be possible. According to the present invention, a television device which is suitable for living environment can be provided since reduction in power consumption, improvement in image quality, and reduction in size and weight thereof can be achieved.

Figure 7B:
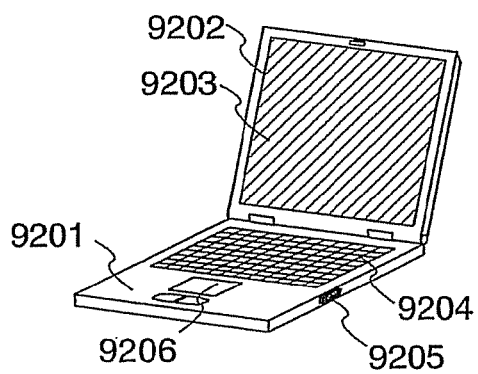

FIG. 7B shows a computer according to the present invention, which includes a main body 9201, a chassis 9202, a display portion 9203, a keyboard 9204, an external connection port 9205, a pointing mouse 9206, and the like. In the computer, the display portion 9203 has a plurality of light emitting elements, which are similar to those described in Embodiment Modes 2 to 5, arranged in matrix. One feature of the light emitting element is that external extraction efficiency of light is high and a short circuit thereof due to dust, impact, or the like can be prevented. The display portion 9203 which includes the light emitting elements has a similar feature. Therefore, in the computer, image quality is hardly deteriorated and lower power consumption can be achieved. With such a feature, a deterioration compensation function and a power source circuit can be significantly removed or reduced, thereby reduction in size and weight of the main body 9201 and the chassis 9202 can be possible. According to the present invention, a computer which is suitable for living environment can be provided since reduction in power consumption, improvement in image quality, and reduction in size and weight thereof can be achieved. In addition, a portable computer with a display portion which can withstand impact of when being carried can be provided.

Figure 7C:
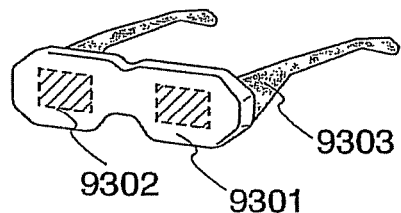

FIG. 7C shows a goggle type display according to the present invention, which includes a main body 9301, a display portion 9302, and an arm portion 9303. In the goggle type display, the display portion 9302 has a plurality of light emitting elements, which are similar to those described in Embodiment Modes 2 to 5, arranged in matrix. One feature of the light emitting element is that external extraction efficiency of light is high and a short circuit thereof due to dust, impact, or the like can be prevented. The display portion 9302 which includes the light emitting elements has a similar feature. Therefore, in the goggle type display, image quality is hardly deteriorated and lower power consumption can be achieved. With such a feature, a deterioration compensation function and a power source circuit can be significantly removed or reduced, thereby reduction in size and weight of the main body 9301 can be possible. According to the present invention, a goggle type display with which a user hardly feels discomfort and has a small load can be provided since reduction in power consumption, improvement in image quality, and reduction in size and weight thereof can be achieved. In addition, a goggle type display with a display portion which can withstand impact of when being worn and carried can be provided.

Figure 7D:
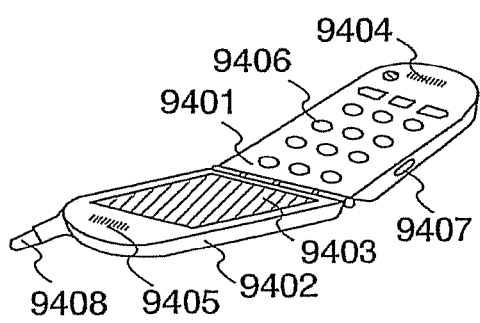

FIG. 7D shows a cellular phone according to the present invention, which includes a main body 9401, a chassis 9402, a display portion 9403, an audio input portion 9404, an audio output portion 9405, an operation key 9406, an external connection port 9407, an antenna 9408, and the like. In the cellular phone, a display portion 9403 has a plurality of light emitting elements, which are similar to those described in Embodiment Modes 2 to 5, arranged in matrix. One feature of the light emitting element is that external extraction efficiency of light is high and a short circuit thereof due to dust, impact, or the like can be prevented. The display portion 9403 which includes the light emitting elements has a similar feature. Therefore, in the cellular phone, image quality is hardly deteriorated and lower power consumption can be achieved. With such a feature, a deterioration compensation function and a power source circuit can be significantly removed or reduced, thereby reduction in size and weight of the main body 9401 and the chassis 9402 can be possible. According to the present invention, a cellular phone which is suitable for being carried can be provided since reduction in power consumption, improvement in image quality, and reduction in size and weight thereof can be achieved. In addition, a cellular phone with a display portion which can withstand impact of when being carried can be provided.

Figure 7E:
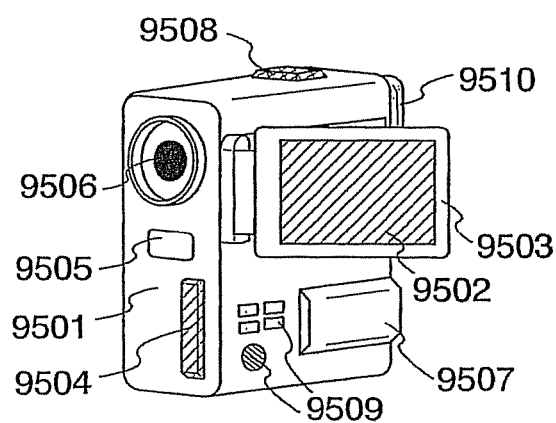

FIG. 7E shows a camera according to the present invention, which includes a main body 9501, a display portion 9502, a chassis 9503, an external connection port 9504, a remote control receiving portion 9505, an image receiving portion 9506, a battery 9507, an audio input portion 9508, an operation key 9509, an eye piece portion 9510, and the like. In the camera, a display portion 9502 has a plurality of light emitting elements, which are similar to those described in Embodiment Modes 2 to 5, arranged in matrix. One feature of the light emitting element is that external extraction efficiency of light is high and a short circuit thereof due to dust, impact, or the like can be prevented. The display portion 9502 which includes the light emitting elements has a similar feature. Therefore, in the camera, image quality is hardly deteriorated and lower power consumption can be achieved. With such a feature, a deterioration compensation function and a power source circuit can be significantly removed or reduced, thereby reduction in size and weight of the main body 9501 can be possible. According to the present invention, a camera which is suitable for being carried can be provided since reduction in power consumption, improvement in image quality, and reduction in size and weight thereof can be achieved. In addition, a camera with a display portion which can withstand impact of when being carried can be provided.

The present application is based on Japanese Patent Application serial No. 2005-089378 filed on Mar. 25, 2005 in Japanese Patent Office, the entire contents of which are hereby incorporated by reference.

The invention claimed is:

1. A light-emitting device comprising:
a semiconductor layer over a substrate;
a gate electrode adjacent to the semiconductor layer with a gate insulating layer interposed therebetween;
an interlayer insulating layer over the gate electrode;
a first conductive layer over the interlayer insulating layer, and electrically connected to the semiconductor layer;
a second conductive layer over and in contact with the first conductive layer;
a resin layer over and in contact with the second conductive layer;
a first electrode over and in contact with the resin layer, wherein the first electrode is electrically connected to the first conductive layer and the second conductive layer;
a laminated body including a light-emitting material over the first electrode;
a second electrode over the laminated body; and
a partition layer over the resin layer and a part of the first electrode.

2. The light-emitting device according to claim 1, wherein the first conductive layer contains one of titanium, tantalum, tungsten, chromium, nickel, and molybdenum.

3. The light-emitting device according to claim 1, wherein the second conductive layer contains aluminum.

4. The light-emitting device according to claim 1, wherein the resin layer contains one of polyimide and acryl.

5. The light-emitting device according to claim 1, wherein the laminated body further contains a mixture material whose resistivity is $5\times10^4$ to $1\times10^6$ Ω·cm.

6. The light-emitting device according to claim 1, wherein the light-emitting device is incorporated in one selected from the group consisting of a television device, a computer, a goggle-type display, a cellular phone, and a camera.

7. A light-emitting device comprising:
a semiconductor layer over a substrate;
a gate electrode adjacent to the semiconductor layer with a gate insulating layer interposed therebetween;
an interlayer insulating layer over the gate electrode;
a first conductive layer over the interlayer insulating layer, and electrically connected to the semiconductor layer;
a second conductive layer over and in contact with the first conductive layer, wherein the first conductive layer is wider than the second conductive layer;
a resin layer over and in contact with the second conductive layer;
a first electrode over and in contact with the resin layer, wherein the first electrode is electrically connected to the first conductive layer and the second conductive layer;
a laminated body including a light-emitting material over the first electrode;
a second electrode over the laminated body; and
a partition layer over the resin layer and a part of the first electrode.

8. The light-emitting device according to claim 7, wherein the first conductive layer contains one of titanium, tantalum, tungsten, chromium, nickel, and molybdenum.

9. The light-emitting device according to claim 7, wherein the second conductive layer contains aluminum.

10. The light-emitting device according to claim 7, wherein the resin layer contains one of polyimide and acryl.

11. The light-emitting device according to claim 7, wherein the laminated body further contains a mixture material whose resistivity is $5 \times 10^4$ to $1 \times 10^6$ Ω·cm.

12. The light-emitting device according to claim 7, wherein the light-emitting device is incorporated in one selected from the group consisting of a television device, a computer, a goggle-type display, a cellular phone, and a camera.

13. A light-emitting device comprising:
a semiconductor layer over a substrate;
a gate electrode adjacent to the semiconductor layer with a gate insulating layer interposed therebetween;
an interlayer insulating layer over the gate electrode;
a first conductive layer over the interlayer insulating layer, and electrically connected to the semiconductor layer;
a second conductive layer over and in contact with the first conductive layer;
a resin layer over and in contact with the second conductive layer, wherein a side surface of the resin layer is aligned with a side surface of the second conductive layer;
a first electrode over and in contact with the resin layer, wherein the first electrode is electrically connected to the first conductive layer and the second conductive layer;
a laminated body including a light-emitting material over the first electrode;
a second electrode over the laminated body; and
a partition layer over the resin layer and a part of the first electrode.

14. The light-emitting device according to claim 13, wherein the first conductive layer contains one of titanium, tantalum, tungsten, chromium, nickel, and molybdenum.

15. The light-emitting device according to claim 13, wherein the second conductive layer contains aluminum.

16. The light-emitting device according to claim 13, wherein the resin layer contains one of polyimide and acryl.

17. The light-emitting device according to claim 13, wherein the laminated body further contains a mixture material whose resistivity is $5 \times 10^4$ to $1 \times 10^6$ Ω·cm.

18. The light-emitting device according to claim 13, wherein the light-emitting device is incorporated in one selected from the group consisting of a television device, a computer, a goggle-type display, a cellular phone, and a camera.

* * * * *